United States Patent [19]
Uda

[11] Patent Number: 5,739,782
[45] Date of Patent: Apr. 14, 1998

[54] RESISTANCE LADDER, D/A CONVERTER AND A/D CONVERTER

[75] Inventor: Nobuya Uda, Itami, Japan

[73] Assignees: Mitsubishi Denki Kabushiki Kaisha, Tokyo; Mitsubishi Electric Semiconductor Software Co., Ltd., Itami, both of Japan

[21] Appl. No.: 757,631

[22] Filed: Dec. 2, 1996

[30] Foreign Application Priority Data

Jul. 26, 1996 [JP] Japan ................................. 8-198167

[51] Int. Cl.⁶ ........................................... H03M 1/78
[52] U.S. Cl. ................................. 341/154; 341/148
[58] Field of Search .............................. 341/154, 148, 341/144, 153, 145

[56] References Cited

U.S. PATENT DOCUMENTS 5,617,091  4/1997  Uda ................................... 341/154

FOREIGN PATENT DOCUMENTS

| | | |
|---|---|---|
| 54-151368 | 11/1979 | Japan . |
| 63-37718 | 2/1988 | Japan . |
| 1-288015 | 11/1989 | Japan . |
| 2-839 | 1/1990 | Japan . |
| 6-112824 | 4/1994 | Japan . |
| 6-224767 | 8/1994 | Japan . |
| 6-209919 | 9/1994 | Japan . |

Primary Examiner—Jeffrey A. Gaffin
Assistant Examiner—Peguy JeanPierre
Attorney, Agent, or Firm—Burns, Doane, Swecker & Mathis, LLP

[57] ABSTRACT

A D/A converter arranged to improve the resolution by changing the number of resistors to be interposed between a resistance ladder, from which a divided voltage between positive and negative voltage sources is taken out, and the positive and negative voltage sources while maintaining the total resistance value at a constant value, in which the resistance value of the resistor to be interposed between the resistance ladder and the positive and negative voltage sources is selected to uniformly lower the divided voltage which is taken by the resistance ladder by a level corresponding to ½ LSB to perform ½ LSB correction.

8 Claims, 11 Drawing Sheets

RESISTANCE LADDER, D/A CONVERTER AND A/D CONVERTER

BACKGROUND OF THE INVENTION

1. Field of the Invention

The present invention relates to a D/A (digital/analog) converter and an A/D (analog/digital) converter using the D/A converter.

2. Description of the Related Art

An A/D converter for converting analog voltage into a digital value requires a reference voltage which is to be compared with a to-be-converted object, i.e., the analog voltage. In an A/D converter of the foregoing type, an analog reference voltage for comparison is generated by a D/A converter having a resistance ladder including a plurality of resistors connected in series.

FIG. 1 is a circuit diagram showing an essential portion of a conventional D/A converter of n-bit resolution comprising the resistance ladder. The illustrated D/A converter has a resolution of 4-bit. A resistance ladder 3 is connected between a positive analog voltage source 1 having a voltage level of VRBF and a negative analog voltage source 2 having a voltage level of AVSS, the resistance ladder 3 consisting of a string of $(2^n-2)[=14]$ resistors 4 each having a resistance value of R and connected in series; a resistor 6 interposed between an end of the string of the resistors 4 and the positive analog voltage source 1 and having a resistance value of $(3/2).R$; and a resistor 5 interposed between another end of the string of the resistors 4 and having a resistance value of $(1/2).R$. The resistor 5 and 6 conduct a ½ LSB correction (LSB: a unit corresponding to a digital value for one bit in a D/A converter and in an A/D converter) so that the total resistance of the resistance ladder 3 is $(16).R$. Thus, divided voltages of $2^4[=16]$ levels by dividing the difference in the potential between the positive analog voltage source 1 and the negative analog voltage source 2 is obtained. Ladder taps T1 to T16 for respectively taking out divided voltages of $2^4$ levels are connected to a connection node of the resistor 5 of the resistance ladder 3 and the negative analog voltage source 2 and connection nodes of the adjacent resistors.

A switching tree 7 has a group of switches 70 to 77 which are controlled to select one of the ladder taps T1 to T16 of the resistance ladder 3 to obtain an analog output 8. The group of the switches 70 to 77 are controlled to be switched on or off in accordance with the level of each of digital signals a, ā, b, b̄, c, c̄, d and d̄ expressing, by positive and negative logics, 4-bit digital values "abcd" supplied from an external control circuit (not shown) through word lines. The switches 70 to 77 respectively are switched on when each of digital values corresponding to the symbols appended thereto in the figure is "1". Therefore, FIG. 1 shows a state where a digital value "abcd" is "$1010_2$", digital values a, b̄, c and d̄ are "1" and other digital values are "0".

Table 1 shows the relationship among the digital values "abcd", voltage levels of the analog output 8 and the ladder taps T1 to T16 from which the foregoing analog voltage levels can be obtained in a case where the voltage VREF of the positive analog voltage source 1 is 4 V and the voltage AVSS of the negative analog voltage source 2 is 0 V. As can be understood from Table 1, voltage levels of the ladder taps are attained as follows: the potential difference between the ladder tap T1, which is the lowermost resistance ladder tap T1 for obtaining the voltage AVSS of the negative analog voltage source 2, and the ladder tap T2 is 0.125 V, the potential difference between the voltage VREF of the positive analog voltage source 1 and the ladder tap T16 is 0.375 V, and the potential difference between each two adjacent ladder taps T2 to T15 is 0.25 V. The ladder taps T1 to T16 take out divided voltage between the voltage VREF of the positive analog voltage source 1 and the voltage AVSS of the negative analog voltage source 2 by $2^4[=16]$.

FIG. 2 shows a sequential approximation type A/D converter of 4-bit resolution disclosed in, for example, Japanese Patent Application Laid-Open No. 54-151368 (U.S. application Ser. No. 879646), comprising the D/A converter shown in FIG. 1. A D/A converter 9 of 4-bit resolution supplies, to a negative terminal (−) of a comparator 16, the analog voltage of any one of the ladder tads T1 to T16 corresponding to the 4-bit digital value shown in Table 1 as a reference voltage for use in a comparison made between an analog input AIN from outside and an analog input 25 which is supplied to a positive input terminal (+) of the comparator 16. A 4-bit control circuit 10 generates a digital value a, ā, b, b̄, c, c̄, d and d̄ corresponding to the 4-bit digital value and supplies the same to the D/A converter 9. Moreover, the 4-bit control circuit 10 determines a 4-bit digital value in accordance with a comparison result signal 20 supplied from the comparator 16, which compares the analog input AIN with the analog output 8 from the D/A converter 9.

The A/D conversion Operation performed by the A/D converter will now be described in the case where the voltage AVSS of the negative analog voltage source is 0 V, the voltage VREF of the positive analog voltage source is 4 V and the analog input AIN is 1.3 V.

To output the reference voltage for comparison from the D/A converter 9, a digital signal corresponding to a digital value of "$1000_2$" in which the uppermost bit "a" of a digital value of "abcd" is set to be "1" is supplied to the D/A converter 9. Thus, the D/A converter 9 supplies, to the comparator 16, the following voltage:

(VREF/2)−(VREF/32)[V](=1.875 V)

Then, the comparator 16 compares the analog output 8 supplied from the D/A converter 9 with the analog input AIN as follows:

[(VREF/2)−(VREF/32)]:AIN

That is, 1.875 V:1.3 V

Since the analog input AIN is lower, the 4-bit control circuit 10 determines the digital value of the bit "a" to be "0" from the comparison result signal 20.

Then, a digital signal corresponding to a digital value of "$0100_2$" in which bit "b" is set to be "1" is supplied to the D/A converter 9 so that the D/A converter 9 applies, to the comparator 16, the following voltage:

(VREF/4)−(VREF/32)[V](=0.875 V)

The comparator 16 compares the analog output 8 supplied from the D/A converter 9 with the analog input AIN as follows:

[(VREF/4)−(VREF/32)]:AIN

That is, 0.875:1.3 V

Since the analog input AIN is higher, the 4-bit control circuit 10 determines the digital value of the bit "b" to be "1" from the comparison result signal 20.

Then, a digital signal corresponding to a digital value of "$0110_2$," in which the bit "c" is set to be "1" is supplied to the D/A converter 9 so that the D/A converter 9 supplies, to the comparator 16, the following voltage:

$$(3 \cdot VREF/8) - (VREF/32)[V] (= 1.375 \text{ V})$$

The comparator 16 compares the analog output 8 supplied from the D/A converter 9 with the analog input AIN as follows:

$$[(3 \cdot VREF/8) - (VREF/32)]:AIN$$

That is,
1.375 V:1.3 V

As a result, the analog input AIN is lower, the 4-bit control circuit 10 determines the digital value of the bit "c" to be "0" from the comparison result signal 20.

Then, a digital signal corresponding to the digital value of "$0101_2$," in which the bit "d" is set to be "1" is supplied to the D/A converter 9 so that the D/A converter 9 supplies, to the comparator 16, the following voltage:

$$(5 \cdot VREF/16) - (VREF/32)[V] (= 1.125 \text{ V})$$

The comparator 16 compares the analog output 8 supplied from the D/A converter 9 with the analog input AIN as follows:

$$[(5 \cdot VREF/16) - (VREF/32)]:AIN$$

That is,
1.125 V:1.3 V

As a result, the analog input AIN is higher, the 4-bit control circuit 10 determines the digital value of the bit "d" to be "1" from the comparison result signal 20.

As a result of the above-mentioned sequential comparison, the analog input AIN of 1.3 V is converted into a digital value of "$0101_2$". As a matter of course, values indicated by the digital value of the A/D converter can be more accurate and more approximated to the analog input as the resolution of the A/D converter raises. The accuracy in converting the analog voltage into a digital value can be improved twice whenever the digital value enlarges by one bit.

The A/D converter provided with the D/A converter having the resistance ladder has the structure such that the D/A converter generates all of the analog reference voltage levels by dividing the potential difference between the positive analog voltage source and the negative analog voltage source by the resistance ladder. Therefore, the A/D converter of this type has an advantage that an extremely accurate voltage can be generated if the ratio of the resistances of the resistors are accurate. Therefore, the A/D converter provided with the D/A converter of this type attains excellent characteristics in linearity and differential non-linearity.

On the other hand, the A/D converter has a disadvantage that a resistor is required in order to generate each of the analog reference voltage levels. For the 4-bit resolution, $2^4 (=16)$ resistors are required. For the 6-bit resolution, $2^6 (=64)$ resistors are required. Therefore, the number of the resistors doubles as the resolution is improved by one bit. As a result, the area for the resistors enlarges excessively and the yield for manufacturing the resistors deteriorates. In particular, the A/D converter is disadvantageous in reducing the cost for manufacturing an LSI. Therefore, there arises a problem to realize a higher resolution.

To solve the above-mentioned problems, the applicant of the present invention has proposed an A/D converter shown in FIG. 3 in Japanese Patent Application No. 6-209919 (filed on Sep. 2, 1994). As shown in FIG. 3, a first resistance group 17 comprises series resistors 4, 51 and 52 for dividing the potential difference between the positive and negative analog voltage sources 1 and 2 into $2^m$ levels; and $2^m$ ladder taps 11 to 15 for respectively taking out the divided voltages. Second and third resistance groups 18 and 19 are respectively inserted into connection routes from the first resistance group 17 to the positive and negative analog voltage sources 1 and 2, each of the second and third resistance groups 18 and 19 having a plurality of resistors 53, the resistance value of which is $(\frac{1}{2}^{n-m}) \cdot R$ (where n>m and each of n and m is an integer). The above-mentioned A/D converter is structured to change the number of the resistors 53, which are inserted into the connection routes to the positive and negative analog voltage sources 1 and 2 so as to change the analog outputs from the ladder taps 11 to 15 into $2^{n-m}$ levels.

As a result, $2^n$ divided voltage levels can be obtained. In the above converter, for example, the resolution is 6-bit and the required resolution of the high order four bits is obtained by changing the connection route between the resistance ladder and the positive analog voltage source 1 and the connection route between the resistance ladder and the negative analog voltage source in order to change the voltage of the ladder tap. Since the number of the resistor elements significantly decreases and also the number of switches in a switching tree 78 decreases, the area of the D/A converter, which is the major portion of the area of the A/D converter, reduces. Thus, the size of the D/A converter reduces. The conversion characteristic for converting the digital value into the analog voltage is, as shown in FIG. 4, obtained with which $2^n$, that is, 64 levels are realized along a straight line W indicating the ideal conversion character.

It is generally preferable that the A/D converter has a characteristic that a straight line connecting the highest level and the lowest level of the analog input voltage which can be A/D-converted intersects the center of a range of an analog input voltage corresponding to the A/D converted digital values. However, the A/D converter disclosed in Japanese Patent Application No. 6-209919, capable of realizing an improved resolution while requiring only a small number of elements, suffers from generation of ½ LSB offset.

SUMMARY OF THE INVENTION

In view of the foregoing, an object of the present invention is to provide a D/A which is capable of decreasing the number of resistor elements of a resistance ladder and preventing offset errors which arise in a result of the conversion and to provide an A/D converter having the D/A converter.

The D/A converter and the A/D converter using the D/A converter are able to obtain resolution equivalent to that obtainable from the conventional structure though the number of resistor and switch elements decreases as compared with the conventional A/D converter and the conventional D/A converter so that the accuracy improves and the size reduces. Since the voltage of the analog output from the D/A converter is corrected by ½ LSB, errors in the analog voltage or in the digital value, which are the results of the conversion, can significantly be prevented.

The principle of the present invention will now be described with reference to FIG. 5. In a case where a 6-bit digital value is converted into an analog voltage, the resistance value of each resistor is selected so that the total resistance value between the positive analog voltage source 1 and the negative analog voltage source 2 is always 16R whenever switches SW0 to SW7 being selectively switched by the low order two bits. Moreover, ladder taps corresponding to the digital values of the high order four bits are selected so that desired analog voltage is obtained. When switches SW0 and SW1 are switched on by the digital value of the low order two bits, a voltage corresponding to (⅞).R is generated between the positive analog voltage source 1 and the negative analog voltage source 2. Thus, a voltage which is, by a level corresponding to (⅛).R, lower than the voltage obtained by dividing, by sixteen, the potential difference between the positive analog voltage source 1 and the negative analog voltage source 2 is generated. A plurality of resistors R are connected among ladder taps TAP1 to TAP15 and the total resistance between the positive analog voltage source 1 and the negative analog voltage source 2 is 16R. Therefore, the voltage lower, by a level corresponding to (⅛).R, that is, by ½ LSB of the 6-bit resolution, than the voltage level obtained by multiplying, by an integer, the level obtained by dividing the potential difference between the positive analog voltage source 1 and the negative analog voltage source 2 by sixteen is generated in all ladder taps except the ladder tap TAP16.

When switches SW2 and SW3 are switched on by the two low order bits, resistors of (⅛).R and (¼).R are interposed between the ladder tap TAP16 and the negative analog voltage source 2. Similarly, resistors of (⅜).R and (¼).R are interposed between the TAP1 and the positive analog voltage source 1. Since the total resistance between the positive analog voltage source 1 and the negative analog voltage source 2 is 16R, a voltage lower, by a level corresponding to (⅝).R, than the voltage level obtained by multiplying, by an integer, the level obtained by dividing the potential difference between the positive analog voltage source 1 and the negative analog voltage source 2 by sixteen is generated in all ladder taps.

When switches SW4 and SW5 are switched on, the resistor of (⅛).R is interposed between the ladder tap TAP16 and the negative analog voltage source 2. Similarly, resistors of (⅜).R, (¼).R and a resistor of (¼).R are interposed between the ladder tap TAP1 and the positive analog voltage source 1. Since the total resistance between the positive analog voltage source 1 and the negative analog voltage source 2 is 16R, a voltage lower, by a level corresponding to (⅞).R, than the voltage level obtained by multiplying, by an integer, the level obtained by dividing the potential difference between the positive analog voltage source 1 and the negative analog voltage source 2 by sixteen is generated in all ladder taps.

When switches SW6 and SW7 are switched on, the resistors of (⅛).R, (¼).R and (¼).R are interposed between the ladder tap TAP16 and the negative analog voltage source 2. Similarly, the resistor of (⅜).R is interposed between the ladder tap TAP1 and the positive analog voltage source 1. Since the total resistance between the positive analog voltage source 1 and the negative analog voltage source 2 is 16R, a voltage lower, by a level corresponding to (⅜).R, than the voltage level obtained by multiplying, by an integer, the level obtained by dividing the potential difference between the positive analog voltage source 1 and the negative analog voltage source 2 by sixteen is generated in all ladder taps.

As described above, four voltage levels are generated from the ladder taps TAP1 to TAP15, three voltage levels, that is, 63 voltage levels are generated from the ladder tap TAP16. The generated voltage is lower than the level obtained by dividing the potential difference between the positive analog voltage source 1 and the negative analog voltage source 2 by ¹⁄₁₂₈, that is, by ½ LSB in the 6-bit resolution. As a result, ½ LSB correction is performed over the D/A converted analog voltage so that an ideal conversion characteristic is obtained.

The above and further objects and features of the invention will more fully be apparent from the following detailed description with the accompanying drawings.

DETAILED DESCRIPTION OF THE PREFERRED EMBODIMENTS

Embodiment 1

Figure 6:
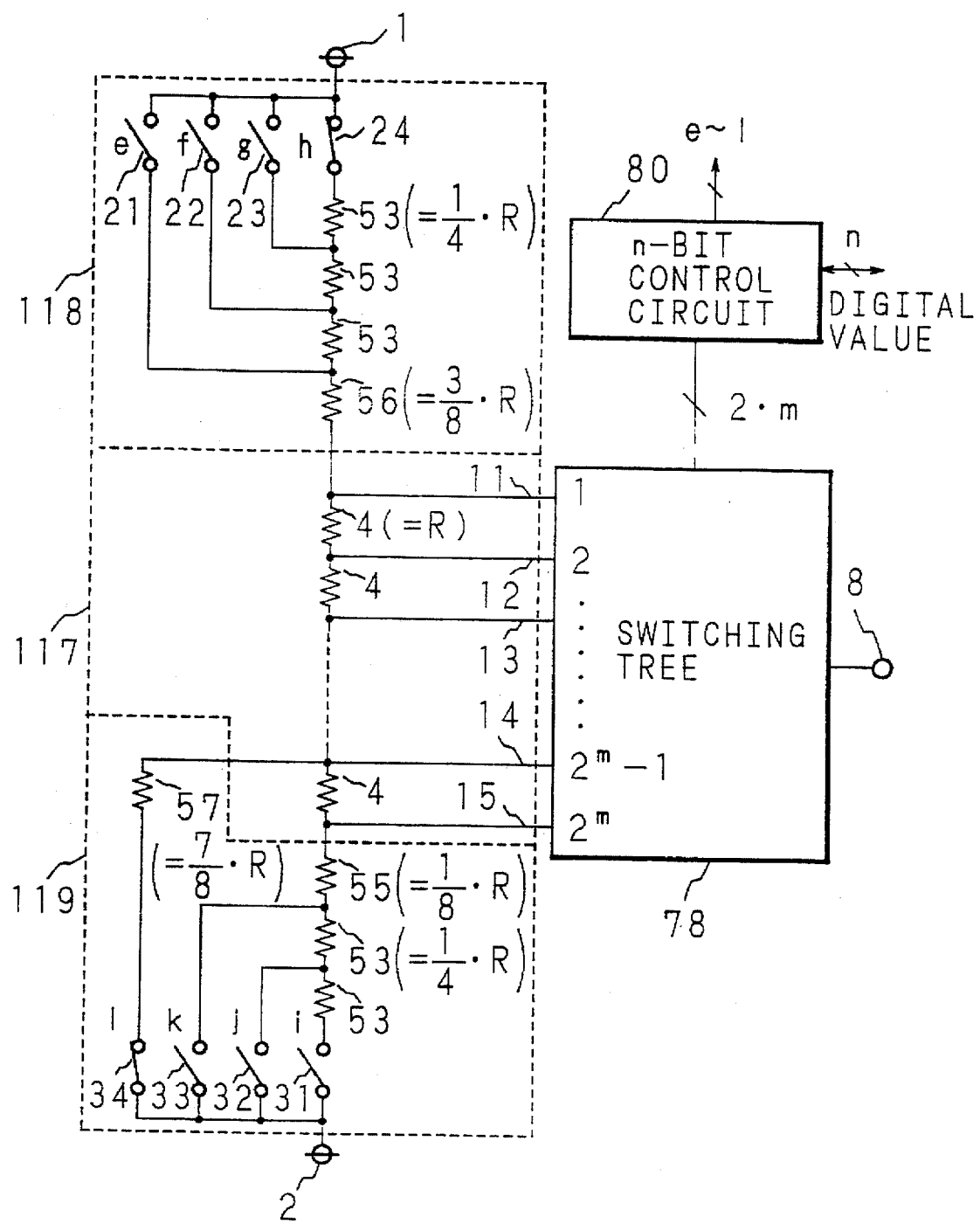
FIG. 6 is a circuit diagram showing the structure of a D/A converter of Embodiment 1 according to the present invention.

FIG. 6 is a circuit diagram showing the structure of a D/A converter of Embodiment 1 according to the present invention. In this embodiment, n=6 and m=4.

A resistance ladder interposed between a positive analog voltage source 1 and a negative analog voltage source 2 is composed of three resistance groups 117, 118 and 119. In first resistance group 117, high order m bits of n bits are used to select a ladder tap; and the connection routes to the positive and negative voltage sources 1 and 2 are changed in accordance with the values of low order (n−m) bits[=low order 2 bits] so that the voltage of the determined ladder tap is changed into $2^{n-m}$ levels. As a result, voltage of an analog output 8 corresponding to the n-bit digital value is output.

The first resistance group 117 comprises $(2^m-1)[=15]$ resistors 4 connected in series and each having a resistance value of R so that total resistance value is $(2^m-1).R$. A ladder tap 11 is connected to an end of a string of the resistors 4, while a ladder tap 15 is connected to another end. Ladder taps 12, 13, . . . , are connected to the connection nodes among the resistors 4 from the side of the end of the string of the resistors 4 to which the ladder tap 11 is connected. The total number of the ladder taps is $2^m[=16]$. In the figure, only some of the ladder taps, that is, ladder taps 11, 12, 13, 14 and 15 are illustrated.

The second resistance group 118 comprises $2^{n-m}-1(=3)$ resistors 83 connected in series and having a resistance value of $(\frac{1}{2}^{n-m}).R[=(\frac{1}{4}).R]$. An end of the string of the resistors 53 connected in series is connected to the ladder tap 11 of the first resistance group 117 through a resistor 86 having a resistance value of $(\frac{2}{2}^{n-m})-(\frac{1}{2}^{n-m+1}).R[=(\frac{3}{8}).R]$. Another end of the resistor string is connected to the positive analog voltage source 1 through a connecting means 24. Moreover, s connection node between the resistors 53 and 56 and the connection nodes between adjacent resistors 53 are connected to the positive analog voltage source 1 through connecting means 21, 22 and 23, respectively.

A third resistance group 119 comprises $(2^{n-m}-2)[=2]$ resistors 53 connected in series and having a resistance value of $(\frac{1}{2}^{n-m}).R[=(\frac{1}{4}).R]$. An end of the string of the resistors 53 connected in series is connected to the ladder tap 15 of the first resistance group 117 through a resistor 55 having a resistance value of $(\frac{1}{2}^{n-m+1}).R[=(\frac{1}{8}).R]$. An end of a resistor 57 having a resistance value of $1-(\frac{1}{2}^{n-m+1}).R[=(\frac{7}{8}).R]$ is connected to the ladder tap 14 of the first resistance group 117, Another end of the string of the resistors 53 connected in series is connected to the negative analog voltage source 2 through a connecting means 31. The connection node between the resistors 53 and that between the resistor 53 and the resistor 55 are connected to the negative analog voltage source 2 through connecting means 32 and 33, respectively. Another end of the resistor 57 is connected to the negative analog voltage source 2 through a connecting means 34.

Figure 1:
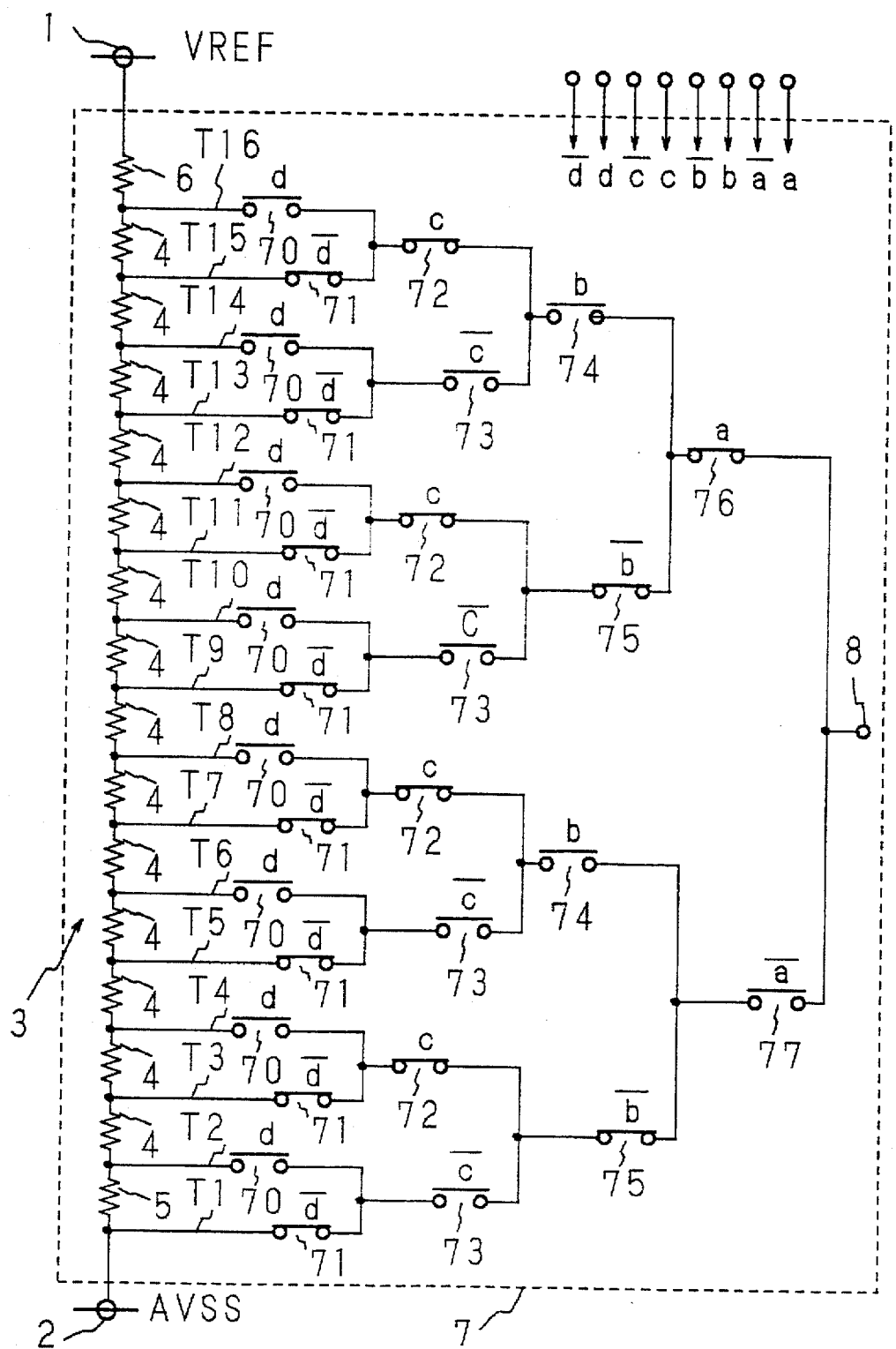
FIG. 1 is a circuit diagram showing the structure of a conventional D/A converter.
Figure 2:
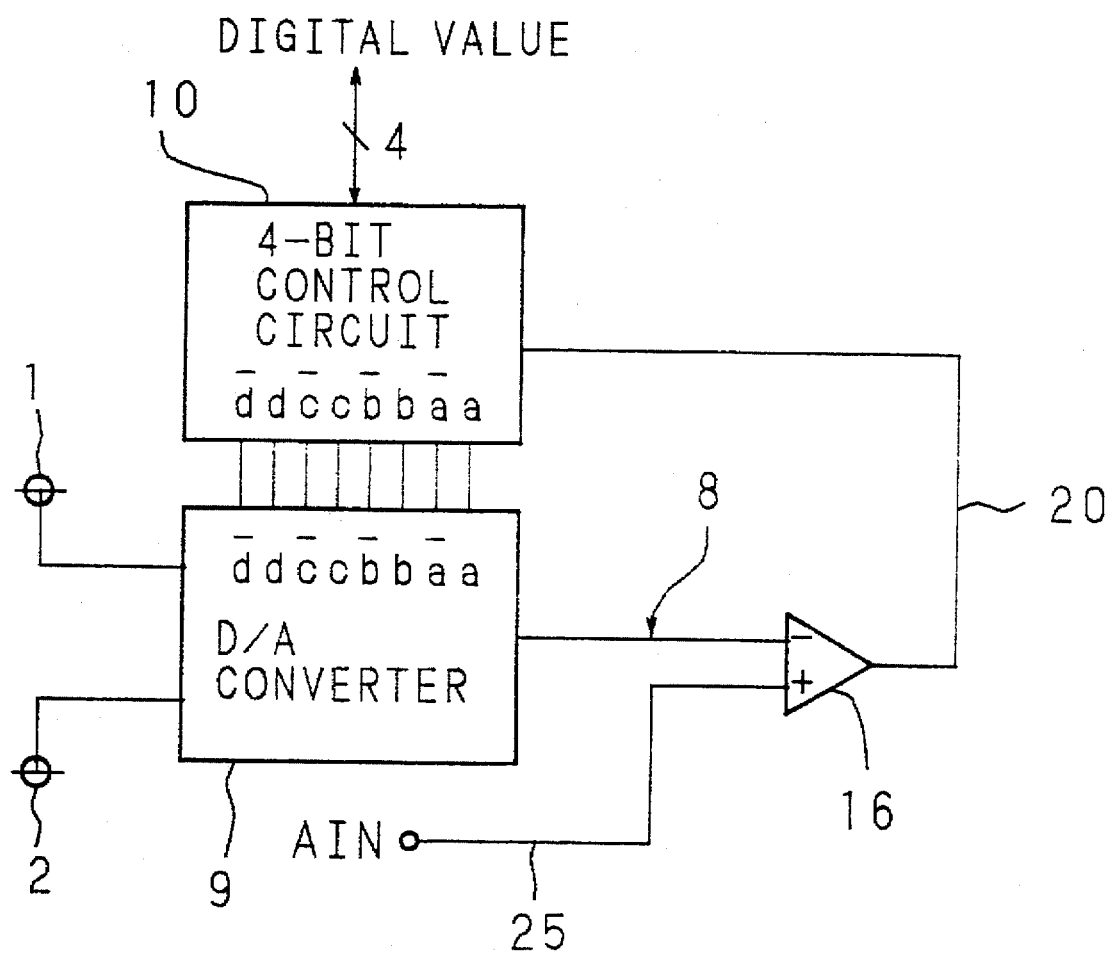
FIG. 2 is a circuit diagram showing the structure of a conventional A/D converter.
Figure 3:
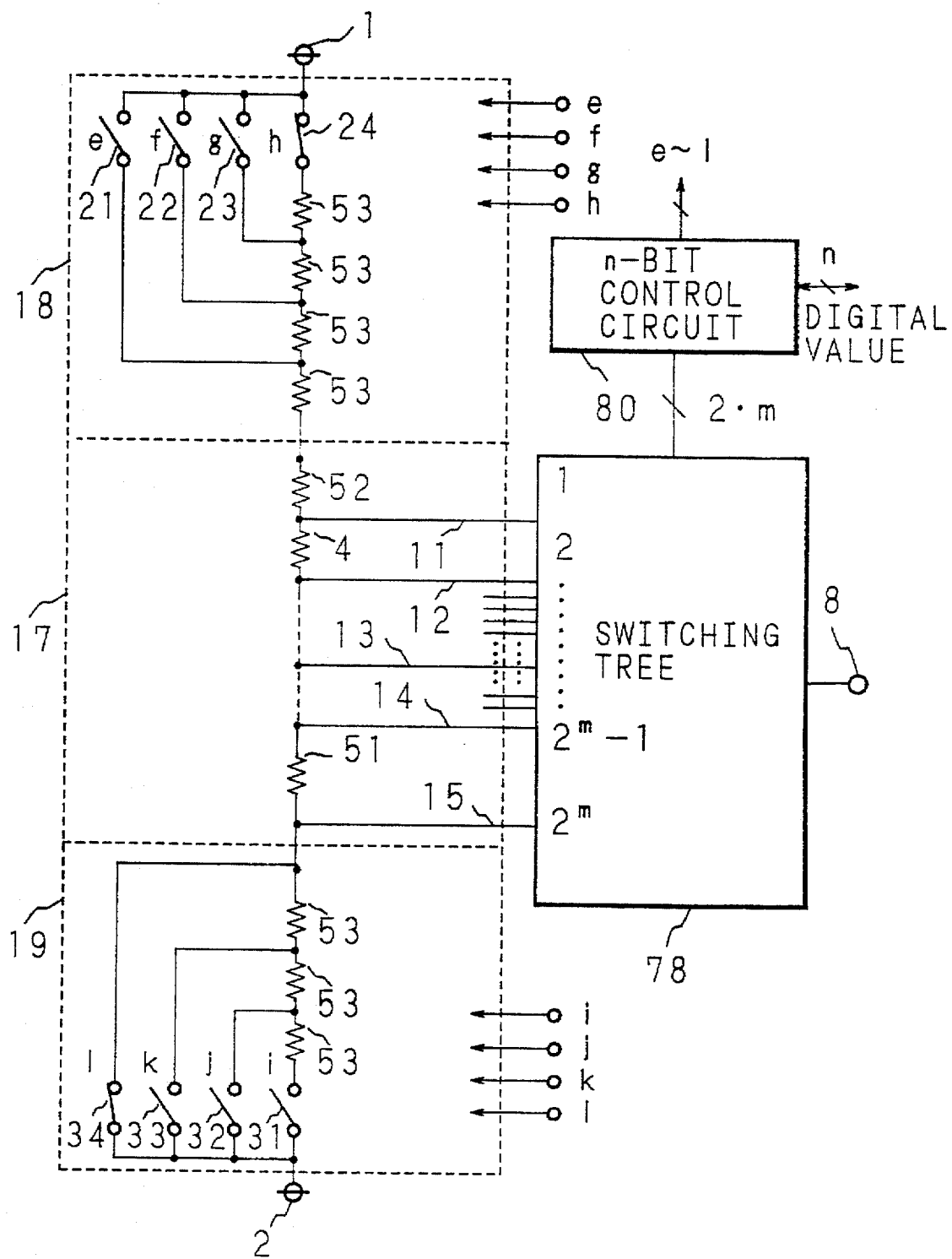
FIG. 3 is a circuit diagram showing another structure of the D/A converter.

A switching tree 78, for selectively connecting the analog voltages of the $(2^m)[=16]$ ladder taps 11 to 15 to the analog output 8, is connected to the ladder taps 11 to 15 of the first resistance group 117. The switching tree 78 has a structure so as to operate similarly to the switching tree 7 shown in FIG. 1.

The connecting means 21 to 24 of the second resistance group 118 and the connecting means 31 to 34 of the third resistance group 119 are connected or disconnected in such a manner that one of the connecting means of the second resistance group 118 and that of the third resistance group 119 are connected in response to control signals e to 1 supplied from an n-bit control circuit 80 which is a first control means.

The n-bit control circuit 80 generates control signals for m bits in order to determine the digital values of the high order m bits through 2.m control signal lines to supply the control signals to the switching tree 78. Moreover, the n-bit control circuit 80 generates the control signals e to 1 for connecting/disconnecting the connecting means 21 to 24 and the connecting means 31 to 34.

The operation of the D/A converter having the foregoing structure will now be described such that an A/D converter having the D/A converter will now be described when the ladder taps 14 and 15 respectively are selected.

When a 6-bit digital value is converted into an analog value, to convert high order 4 bits of 6 bits into an analog value in the first place, the n-bit control circuit 80 makes control signals h and 1 to be significant to connect the connecting means 24 and 34. At the same time, the n-bit control circuit 80 supplies through 2.m control signal lines, to the switching tree 78, a control signal corresponding to the digital value of the high order 4 bits to switch on the corresponding switches of the switching tree 78. The switching tree 78 selects, from the ladder taps 11 to 15 of the first resistance group 117, a ladder tap to take out an analog output corresponding to the digital value of the high order 4 bits.

Since low order two bits is "$00_2$" in conversion of the high order 4 bits, the connecting means 24 and 34 are connected so that a series circuit consisting of the resistors 53, 53, 53, 56, 4 and 57 of the first, second and third resistance groups 117, 118 and 119 is interposed between the positive analog voltage source 1 and the negative analog voltage source 2. At this time, the total resistance between the positive analog voltage source 1 and the negative analog voltage source 2 is $(2^m).R$. Similarly to the conventional sequential approximation method, a ladder tap which is generating the most approximating analog output voltage in a range in which the analog output voltage is lower than the analog input voltage (AIN) is searched from the highest order bit so as to obtain a result of the A/D conversion of the high order four bits.

If the result of the A/D conversion of the high order four bits is "$0001_2$", the ladder tap 14 is selected by the switching tree 78 so as to be connected to the analog output 8. Since the resistance value of the resistor 56 is $(\frac{3}{8}).R$ and that of the resistor 57 is $(\frac{7}{8}).R$, voltage corresponding to 7/128 of the potential difference between the positive analog voltage source 1 (VREF) and the negative analog voltage source 2 (AVSS) is generated.

Figure 4:
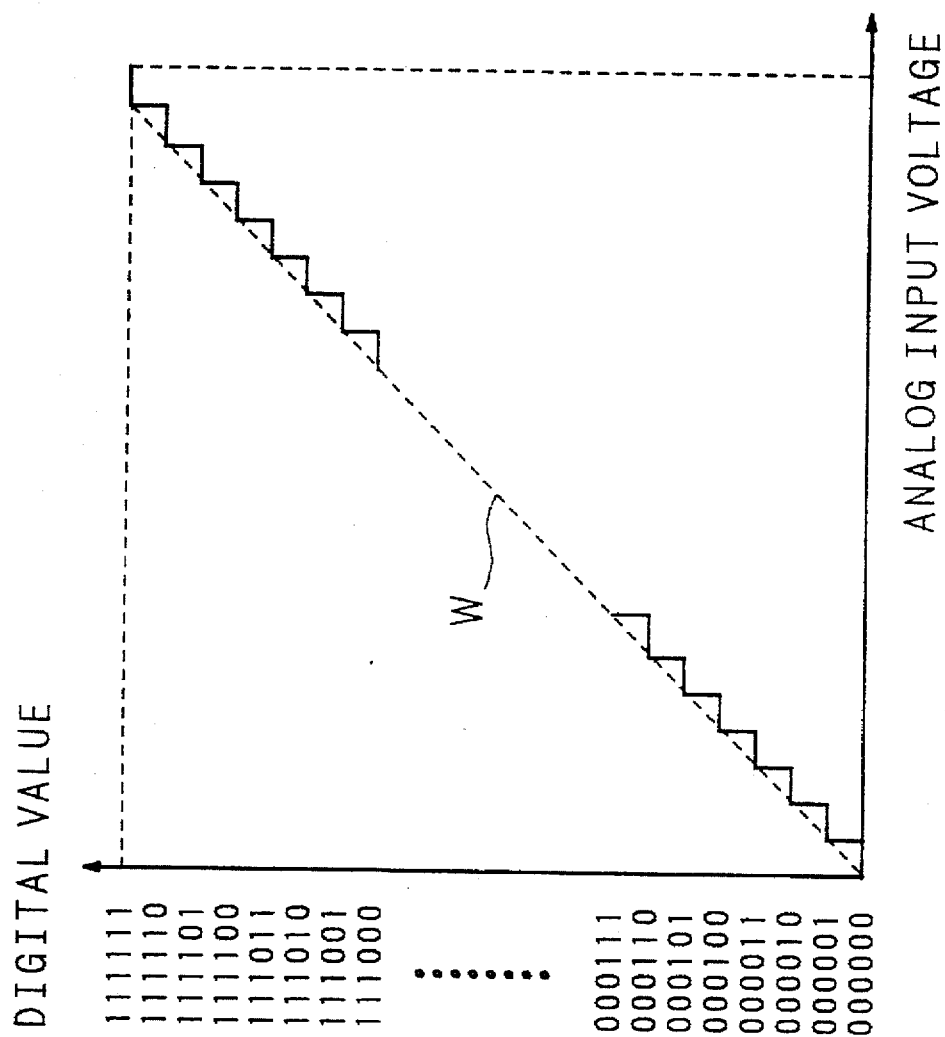
FIG. 4 is a graph showing a conversion characteristic of the D/A converter.
Figure 5:
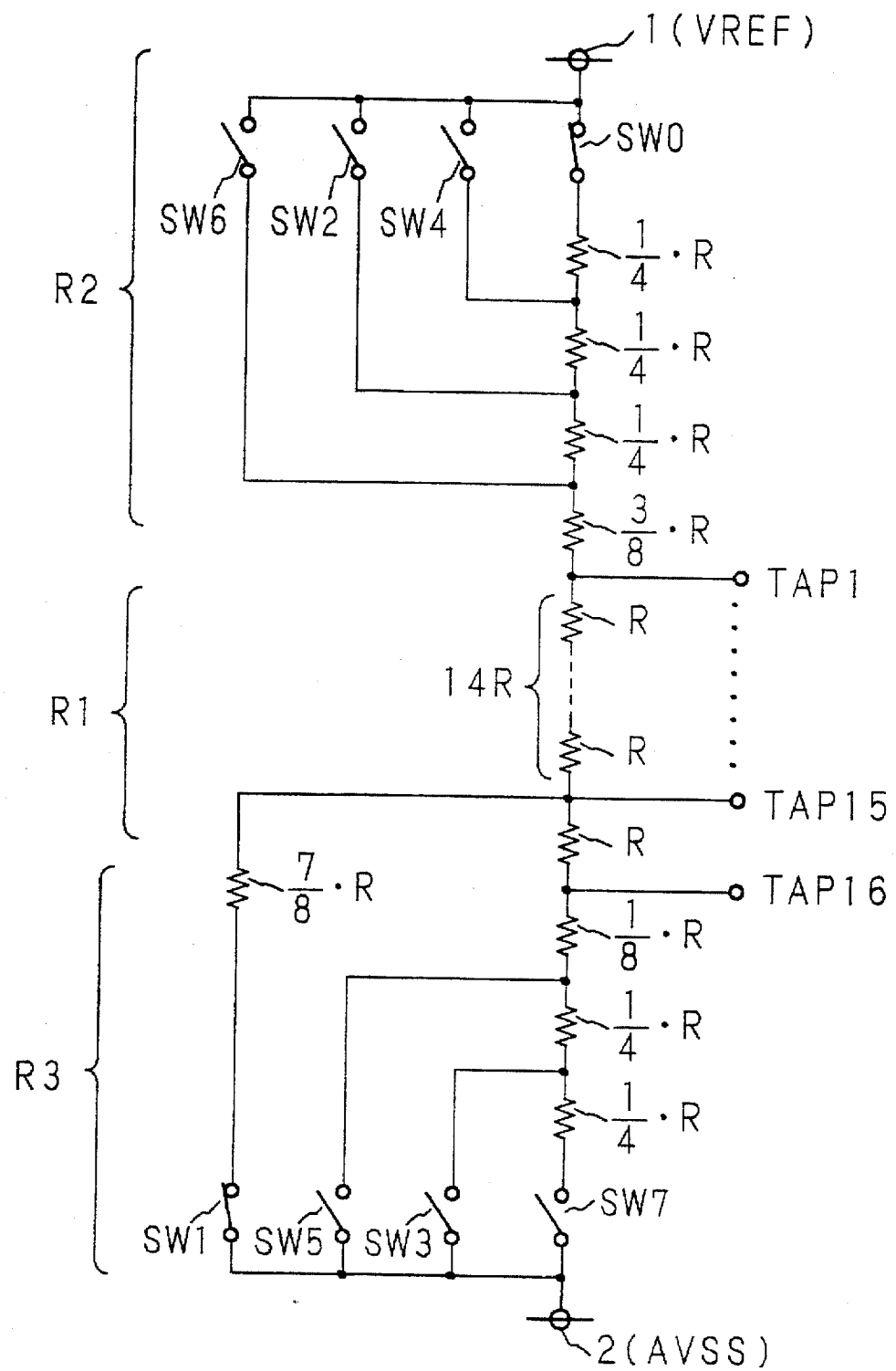
FIG. 5 is a view of explanatory of the principle of an A/D converter according to the present invention.
Figure 7:
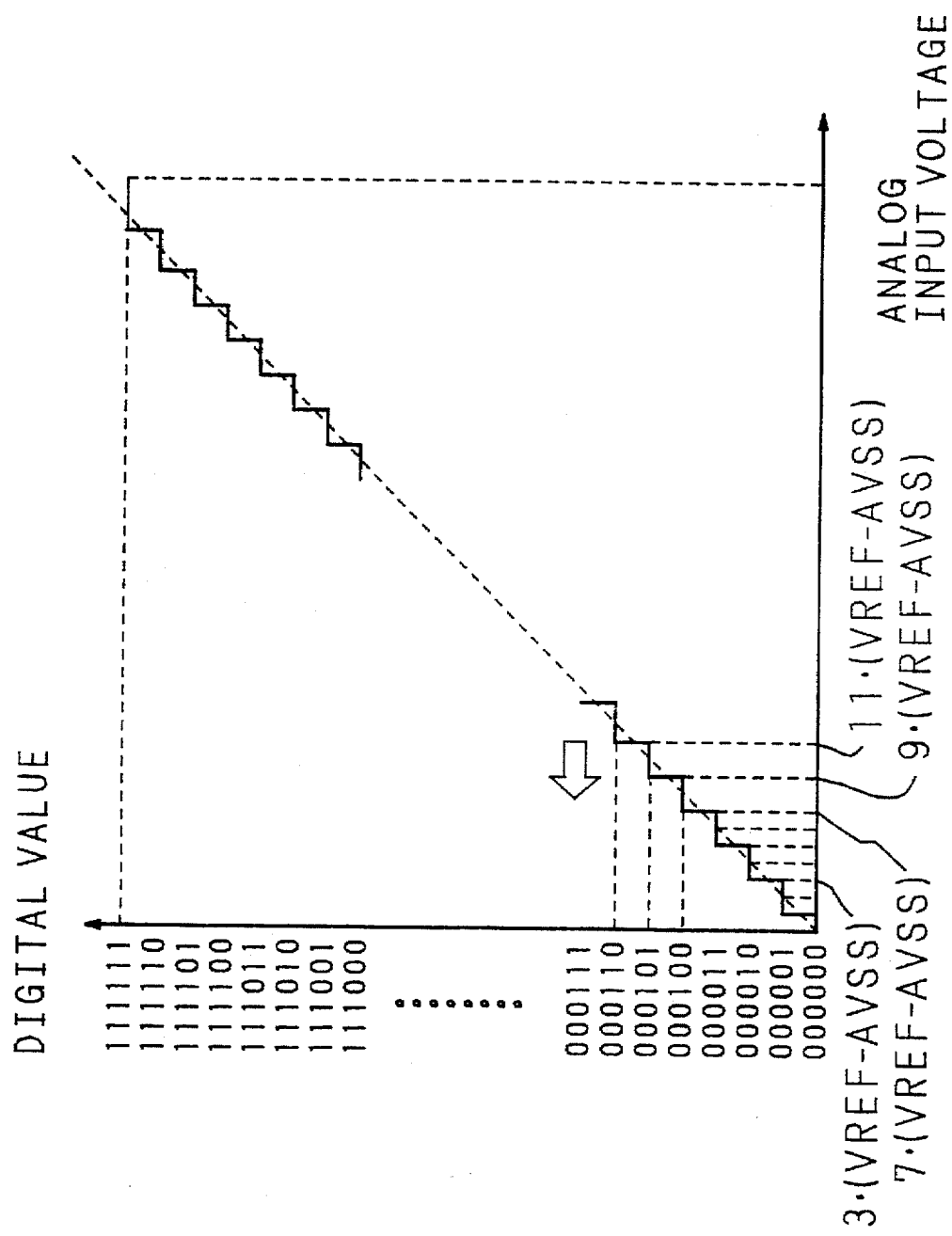
FIG. 7 is a graph showing a conversion characteristic of the D/A converter according to the present invention.

That is, according to the conversion characteristic of the circuit disclosed in Japanese Patent Application No. 6-209919 shown in FIG. 4, if high order four bits is "$0001_2$" and the low order two bits is "$00_2$", the voltage of the ladder tap 14 is $\frac{1}{16}$ of the potential difference between VREF and AVSS. On the other hand, the conversion characteristic of the D/A converter according to the present invention is as shown in FIG. 7 so that the voltage lowers by half of 1 LSB in the 6-bit resolution[=64-level resolution], that is, by ½ LSB. The voltage of the analog output 8 is, in terms of the LSB, the same as "3.5" LSB which is lower than a decimal value of "4" corresponding to the digital value "000100" by "0.5" LSB. Consequently, the analog voltage corresponding to the digital value is corrected by ½ LSB. Since the resistance value of each of the resistors 4 among the ladder taps 11 to 15 is R, the analog voltages among the ladder taps 11 to 15 corresponding to the digital value of the high order four bits have a uniform potential difference. Thus, it can be understood from the conversion characteristic shown in FIG. 7 that each of the voltages of the ladder taps 11 to 15 is corrected uniformly by ½ LSB.

After the analog conversion of the high order bits of the digital value has been completed, the n-bit control circuit 80 makes one of the control signals e to g and one of the control signals i to k significant in accordance with the low order two bits with the switching tree 78 selecting the ladder tap 14. Thus, the n-bit control circuit 80 forms the connection routes to the positive and negative voltage sources 1 and 2 by combining the connecting means 21 to 23 and those 31 to 33 of the second and third resistance groups 118 and 119. In an example case where the digital value of the low order two bits is "$10_2$", the control signals f and t are made to be significant so that the connecting means 22 and 32 are connected. Thus, the series resistor consisting of the first, second and third resistance groups is interposed between the positive analog voltage source 1 and the negative analog voltage source 2. Also in this case the total resistance between the positive and negative voltage sources 1 and 2 is $(2^m).R$, the resistance between the ladder tap 14 and the negative analog voltage source 2 is $(1\frac{1}{8}).R$, which is a resistance value corresponding to $(\frac{1}{2}).R$ is added to the foregoing resistance value in which the low order two bits is "$00_2$". On the other hand, the resistance between the ladder tap 14 and the positive analog voltage source 1 reduces by a resistance value corresponding to $(\frac{1}{2}).R$. Therefore, the amount of change in the voltage of the ladder tap 14 is $\frac{1}{32}$ of the potential difference between VREF and AVSS, which makes the voltage of the analog output 8 be {11.(VREF–

AVSS)}/128. Then, the A/D converter compares the analog input voltage (AIN) to the output voltage from the D/A converter. With the output voltage from the D/A converter, which has been corrected by ½ LSB, a result of the A/D conversion of the fifth bit from the highest order bit of the digital value is obtained.

In a case where the digital value is "$000111_2$", the control signals e and i are made to be significant and the connecting means 21 and 31 are connected. As a result, the divided voltage of the ladder tap 14 is, similarly to the foregoing case, shifted toward the voltage AVSS of the negative analog voltage source 2. The combined resistance value of the third resistance group 119 is made to be (13/8) .R so that the voltage of the analog output 8 is made to be {13.(VREF−AVSS)}/128. In a case where the digital value is "$000101_2$", the control signals g and k are made to be significant so that the connecting means 23 and 33 are connected. As a result, the analog output 8 is made to be {9.(VREF−AVSS)}/128 which coincides with the conversion characteristic shown in FIG. 7.

In a case where the result of the comparison to the high order four bits is "$0000_2$", the ladder tap 15 is selected. Since the low order two bits is "$00_2$" at this time, a series circuit consisting of the resistors 53, 53, 53, 56, 4, 4 ... and 57 of the first, second and third resistance groups 117, 118 and 119 is interposed between the positive analog voltage source 1 and negative analog voltage source 2, which is formed by the connecting means 24 and 34 as mentioned above. At this time, the ladder tap 15 is connected to the ladder tap 14 through the resistors 4 so that if the digital value is "$000000_2$", the potential is the same as that of the ladder tap 14. But a critical problem does not arise since the A/D converter employing the sequential approximation method does not perform a comparison with respect to "$000000_2$".

In comparing the low order two bits after conversion to the high order four bits has been completed, if the digital value is "$000010_2$", the control signals f and j are made significant so that the connecting means 22 and 32 are connected. As a result, a series resistance is, through the first, second and third resistance groups 117, 118 and 119, interposed between the positive analog voltage source 1 and the negative analog voltage source 2. At this time, the combined resistance value of the third resistance group 119 is made to be (⅜).R and the voltage of the analog output 8 is made to be {3.(VREF−AVSS)}/128, which coincides with the conversion characteristic shown in FIG. 7. In a case where the digital value is "$000011_2$", the connecting means 21 and 31 are connected so that the voltage of the analog output 8 is made to be {5.(VREF−AVSS)}/128 which coincides with the conversion characteristic shown in FIG. 7. In a case where the digital value is "$000001_2$", the connecting means 23 and 33 are connected so that the voltage of the analog output 8 is made to be {(VREF−AVSS)}/128 which coincides with the conversion characteristic shown in FIG. 7.

The A/D converter comprising the D/A converter having the above-mentioned structure enables size reduction because of the fewer resistors and the switches. Moreover, the analog voltage obtained from the D/A converter is corrected by ½ LSB so that an ideal characteristic in A/D conversion is obtained.

Embodiment 2

Figure 8:
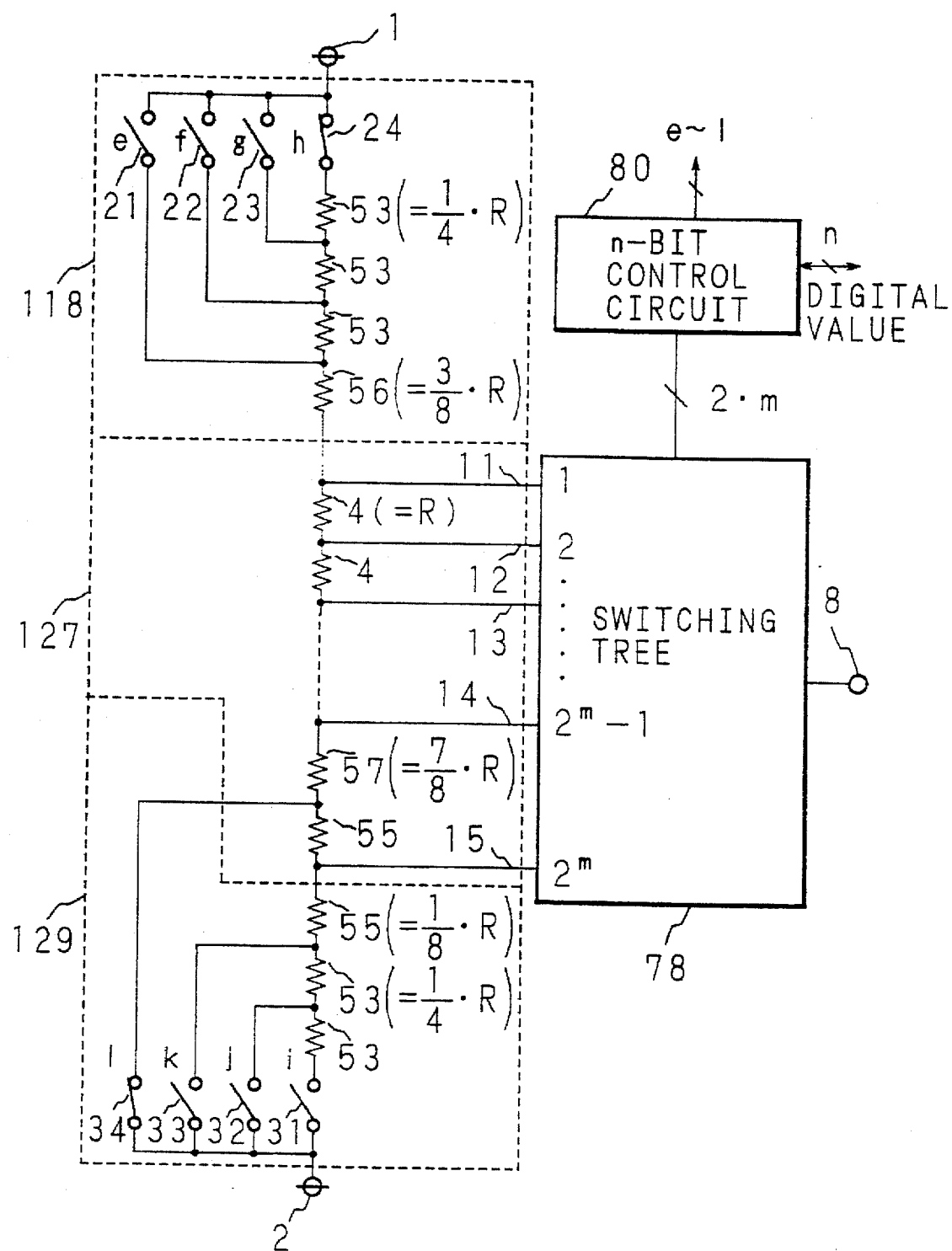
FIG. 8 s a circuit diagram showing the structure of a D/A converter of Embodiment 2 according to the present invention.

FIG. 8 is a circuit diagram showing a D/A converter of Embodiment 2 according to the present invention. According to this embodiment, a series circuit consisting of ($2^n-m-3$) resistors 57 each having a resistance value of ($1½^{n-m+1}$).R[=(⅞).R] and ($2^{n-m}-3$) resistors 55 each having a resistance value of ($½^{n-m+1}$).R[=(⅛).R] is interposed between the ladder tap 14 and the ladder tap 15. The connection node between the resistors 57 and 55 is connected to the negative analog voltage source 2 through the connecting means 34. The structure of other parts is similar to that shown in FIG. 6 except the resistor 4 interposed between the ladder taps 14 and 15 and a series circuit consisting of the resistor 57 and the connecting means 34 interposed between the ladder tap 14 and the negative analog voltage source 2. The same elements are designated by the same reference numerals.

In this embodiment, a first resistance group 127 is formed by ($2^m-2$) resistors 4, a resistor 57 having a resistance value of ($1½^{n-m+1}$).R, a resistor 55 having a resistance value of ($½^{n-m+1}$).R, the ladder tads 11 and 14 respectively connected to both ends of the string of the resistors 4, ladder taps 12, 13, ..., connected to the connection nodes of the resistors 4 and the ladder tap 1 S connected to an end of the resistor 55. Moreover, a third resistance group 129 is formed by the resistor 55 and the resistors 53 and connecting means 31, 32, 33 and 34 respectively interposed between the connection node of the resistors 55 and 53 and the negative analog voltage source 2, between the connection node of the resistors 53 and the negative analog voltage source 2, and the connection node of the resistor 57 and the resistor 55 of the first resistance group 127 and the negative analog voltage source 2. Similarly to Embodiment 1, n=6 and m=4.

In such D/A converter having the above-mentioned structure, similar to the D/A converter shown in FIG. 6, the n-bit control circuit 80 makes the control signals h and l significant to analog-convert high order four bits of six bits so that the connecting means 24 and 34 are connected. At the same time, the n-bit control circuit 80 supplies a control signal corresponding to the digital value of the high order four bits to the switching tree 78. The switching tree 78 selects, from the ladder taps 11 to 15 of the first resistance group 127, a ladder tap to take out an analog output corresponding to the digital value of the high order four bits.

In a case where the result of the comparison to the high order four bits is "$0001_2$", the ladder tap 14 is selected. The total resistance between the positive and negative voltage sources 1 and 2 is ($2^{-m}$).R, the resistance value of the resistor 56 is (⅜).R and the resistance value of the resistor 57 is (⅞).R which is lower than the resistance R of the resistor 4 by (⅛).R. Therefore, the divided voltage from the ladder tap 14 is shifted toward the voltage AVSS of the negative analog voltage source 2 in accordance with the resistance value (⅛).R. Similarly to the D/A converter shown in FIG. 6, the converted analog voltage is corrected by ½ LSB.

After analog conversion of the high order four bits of the digital value has been converted, the n-bit control circuit 80 makes one of the control signals e to g and one of the control signals i to k significant in accordance with the digital value of the low order two bits with the switching tree 78 selecting the ladder tap 14. Thus, the n-bit control circuit 80 forms the connection route between the positive and negative voltage sources 1 and 2 by combining the connecting means 21 to 23 and those 31 to 33. If the digital value of the low order two bits is "$10_2$", the control signals f and j are made to be significant so that the connecting means 22 and 32 are connected. As a result, a series resistance consisting of the first, second and third resistance groups 127, 118 and 129 is interposed between the positive and negative voltage sources 1 and 2. The total resistance value between the positive and negative voltage sources 1 and 2 is made to be ($2^m$).R. In this case, a series resistance consisting of the resistors 57 and 55 is interposed between the ladder taps 14 and 15. In this case, the combined resistance value is R. The resistance of the resistor 55 between the ladder tap 15 and the resistor 53 is $(\frac{1}{8}).R$ which is half the resistance of the resistor 53. In a case where the result of conversion of the D/A conversion of the high order four bits is "$0001_2$", the ladder tap 14 is selected by the switching tree 78 so as to be connected to the analog output 8. Since the resistance value of the resistor 56 is made to be $(\frac{3}{8}).R$ and the resistance value of the resistor 55 is made to be $(\frac{1}{8}).R$, voltage corresponding to $\frac{7}{128}$ of the potential difference between the positive analog voltage source 1 (VREF) and the negative analog voltage source 2 (AVSS) appears at the ladder tap 14. Since the resistance value of each of the resistors 4 among the ladder taps 11 to 14 is equally R, in all digital values indicated by the high order four bits, the ½ LSB correction in the 6-bit resolution is performed. Also the low order two bits are D/A converted similarly to the case shown in FIG. 6.

When the connecting means 34 is connected, that is, when the digital value is "$000000_2$", the voltage at the connection node between the resistor 57 and the resistors 55 is made to be 0 V which is the same level as the voltage of the ladder tap 15 if the negative analog voltage source 2 is 0 V.

The D/A converter having the above-mentioned structure enables the size reduction because of fewer resistors and the switches. Moreover, the analog voltage corresponding to the digital value can be corrected by ½ LSB. When all bits of the digital values are "0", the D/A converter is able to generate 0 V as the analog output 8.

Embodiment 3

Figure 9:
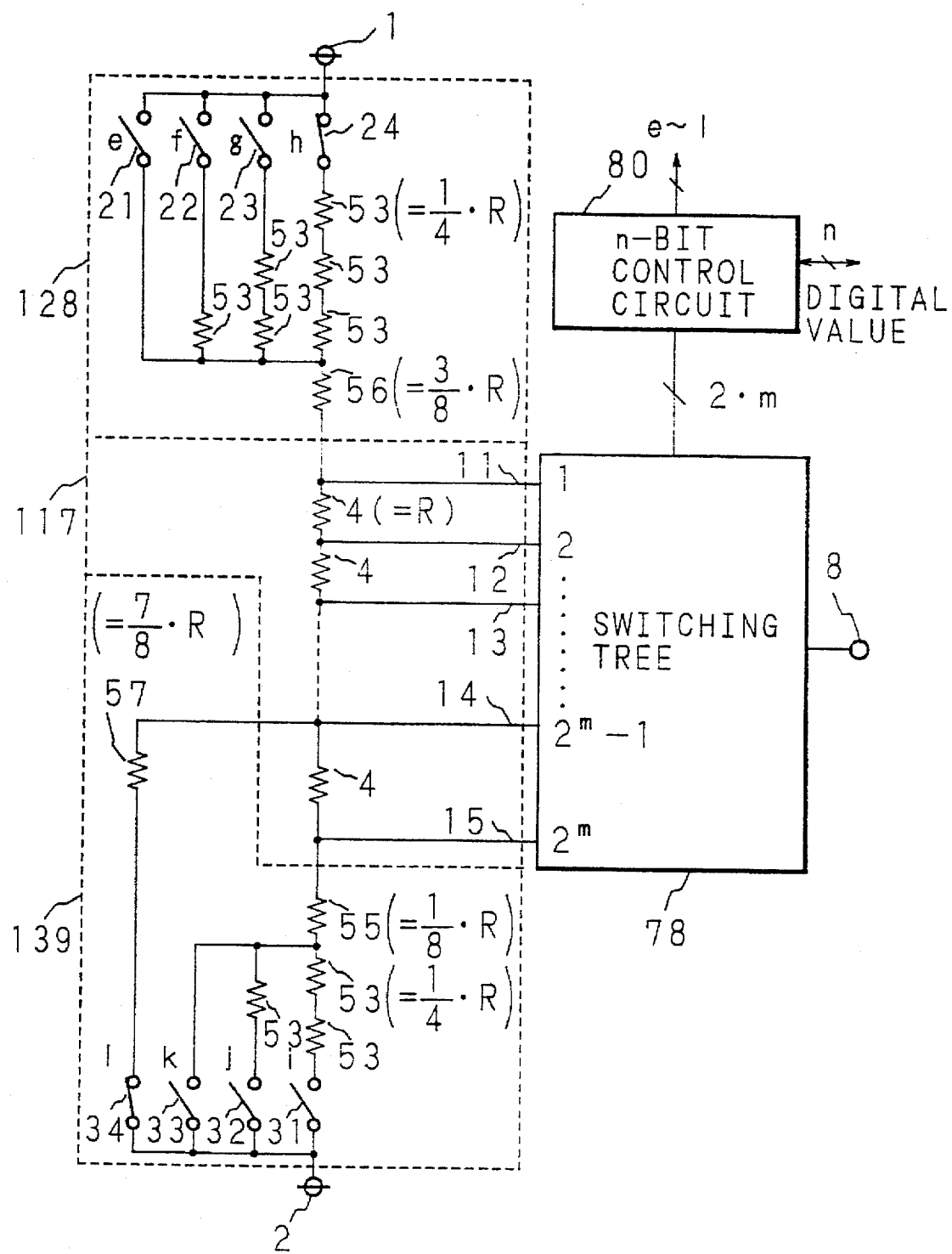
FIG. 9 s a circuit diagram showing the structure of a D/A converter of Embodiment 4 according to the present invention.

FIG. 9 is a circuit diagram showing the structure of a D/A converter of Embodiment 3 according to the present invention. A series circuit formed by the connecting means 23 and $(2^{n-m}-2)[=2]$ resistors 53 each having a resistance value of $(\frac{1}{2}^{n-m}).R[=(\frac{1}{4}).R]$ is, in parallel, connected to a series circuit formed by the connecting means 24 and $(2^{n-m}-1)[=3]$ resistors 53 each having a resistance value of $(\frac{1}{2}^{n-m}).R[=(\frac{1}{4}).R]$. Moreover, a series circuit formed by the connecting means 22 and $(2^{n-m}-3)[=1]$ resistor(s) 53 each having a resistance value of $(\frac{1}{2}^{n-m}).R[=(\frac{1}{4}).R]$ is connected in parallel. Moreover, the connecting means 21 is connected in parallel. A connection node commonly connecting a first resistor string having the three resistors 53 connected in series, a second resistor string having the two resistors 53 connected in series, a third resistor string having the one resistor 53 and the connecting means 21 is connected to an end of the resistor 56 having a resistance value of $(\frac{3}{2}^{n-m}-\frac{1}{2}^{n-m+1}).R[=(\frac{3}{8}).R]$. Thus, a second resistance group 128 is formed.

A series circuit formed by the connecting means 32 and $(2^{n-m}-1)[=1]$ resistor(s) 53 each having a resistance value of $(\frac{1}{2}^{n-m}).R[=(\frac{1}{4}).R]$ is, in parallel, connected to a series circuit formed by the connecting means 31 and $(2^{n-m}-2)[=2]$ resistors 53 each having a resistance value of $(\frac{1}{2}^{n-m}).R[=(\frac{1}{4}).R]$. Moreover, the connecting means 33 is connected in parallel. The connection node to which a fourth resistor string having the two resistors 53 connected in series, a fifth resistor string having the only one resistor 53 and the connecting means 33 are commonly connected is connected to an end of a resistor 55 having a resistance value of $(\frac{1}{2}^{n-m+1}).R[=(\frac{1}{8}).R]$. Another end of the resistor 55 is connected to the ladder tap 15. The connection node to which the connecting means 31, 32, 33 and 34 are commonly connected is connected to the negative analog voltage source 2. A sixth resistor string composed of a resistor 57 having a resistance value of $(1\frac{1}{2}^{n-m+1}).R[=(\frac{7}{8}).R]$ is interposed between the connecting means 34 and the ladder tap 14. As a result, a third resistance group 139 is formed. The structure of other parts is the same as the D/A converter except the first and third resistance groups 118 and 119 shown in FIG. 6. The elements are designated by the same reference numerals.

The D/A converter having the above-mentioned structure operates similarly to the D/A converter shown in FIG. 6. That is, in each of cases where the connecting means 24 and 34 are connected, where the connecting means 23 and 33 are connected, where the connecting means 22 and 32 are connected and where the connecting means 21 and 31 are connected, a combined resistance value between the positive and negative voltage sources 1 and 2 is obtained similar to that in each of cases where the connecting means 24 and 34 are connected, where the connecting means 23 and 33 are connected, where the connecting means 22 and 32 are connected and where the connecting means 21 and 31 are connected in the D/A converter shown in FIG. 6. Thus, the total resistance between the positive and negative voltage sources 1 and 2 is $(2^m).R$. Thus, the analog voltage corresponding to the digital value can be corrected by ½ LSB as mentioned before.

Therefore, also the D/A converter according to this embodiment is able to reduce the size because of fewer elements, such as the resistors and switches, than the conventional D/A converter. Moreover, error in the result of conversion can be restrained.

Embodiment 4

Figure 10:
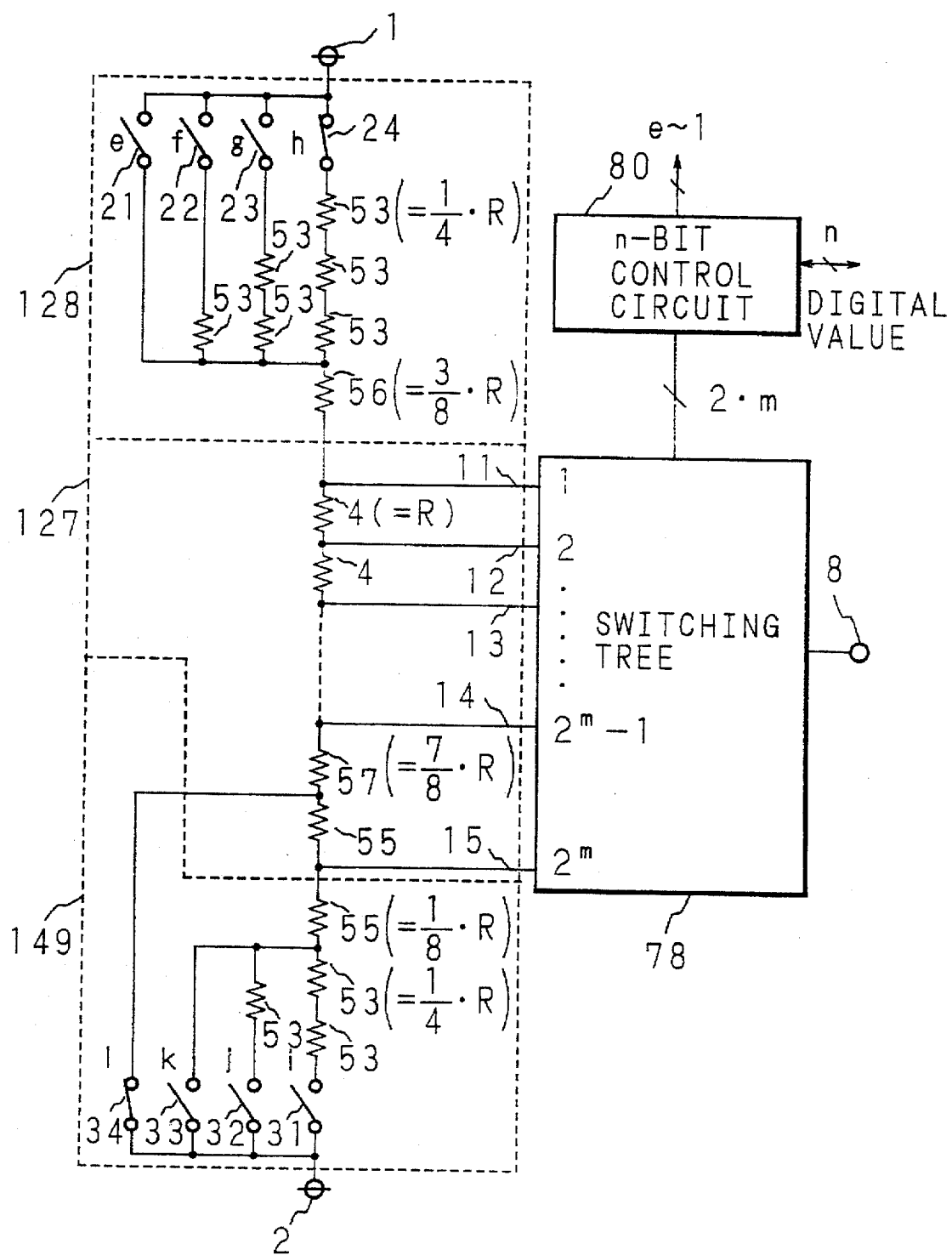
FIG. 10 is a circuit diagram showing the structure of a D/A converter of Embodiment 4 according to the present invention.

FIG. 10 is a circuit diagram showing the structure of a D/A converter of Embodiment 4 according to the present invention. A series circuit formed by the connecting means 23 and $(2^{n-m}-2)[=2]$ resistors 53 each having a resistance value of $(\frac{1}{2}^{n-m}).R[=(\frac{1}{4}).R]$ is, in parallel, connected to a series circuit formed by the connecting means 24 and $(2^{n-m}-1)[=3]$ resistors 53 each having a resistance value of $(\frac{1}{2}^{n-m}).R[=(\frac{1}{4}).R]$. Moreover, a series circuit formed by the connecting means 22 and $(2^{n-m}-3)[=1]$ resistor(s) 53 each having a resistance value of $(\frac{1}{2}^{n-m}).R[=(\frac{1}{4}).R]$ is connected in parallel. Moreover, the connecting means 21 is connected in parallel. A connection node commonly connecting a first resistor string having the three resistors 53 connected in series, a second resistor string having the two resistors 53 connected in series, a third resistor string having the one resistor 53 and the connecting means 21 is connected to an end of the resistor 56 having a resistance value of $(\frac{3}{2}^{n-m}-\frac{1}{2}^{n-m+1}).R[=(\frac{3}{8}).R]$. Thus, a second resistance group 128 is formed.

A series circuit formed by the connecting means 32 and $(2^{n-m}-3)[=1]$ resistor(s) 53 each having a resistance value of $(\frac{1}{2}^{n-m}).R[=(\frac{1}{4}).R]$ is, in parallel, connected to a series circuit formed by the connecting means 31 and $(2^{n-m}-2)[=2]$ resistors 53 each having a resistance value of $(\frac{1}{2}^{n-m}).R[=(\frac{1}{4}).R]$. Moreover, the connecting means 33 is connected in parallel. The connection node to which a fourth resistor string having the two resistors 53 connected in series, a fifth resistor string having the only one resistor 53 and the connecting means 33 are commonly connected is connected to an end of a resistor 55 having a resistance value of $(\frac{1}{2}^{n-m+1}).R[=(\frac{1}{8}).R]$. Another end of the resistor 55 is connected to the ladder tap 15. The connection node to which the connecting means 31, 32, 33 and 34 are commonly connected is connected to the negative analog voltage source 2. The connecting means 34 is connected to the connection node between the resistors 57 and 55 of the first resistance group 127. Thus, a third resistance group 149 is formed. The structure of other parts is similar to the D/A converter except the second and third resistance groups 118 and 129 shown in FIG. 8. The same elements are designated by the same reference numerals.

The D/A converter having the above-mentioned structure operates similarly to the D/A converter shown in FIG. 8.

That is, in each of cases where the connecting means 24 and 34 are connected, where the connecting means 23 and 33 are connected, where the connecting means 22 and 32 are connected and where the connecting means 21 and 31 are connected, a combined resistance value between the positive and negative voltage sources 1 and 2 is obtained similar to that in each of cases where the connecting means 24 and 34 are connected, where the connecting means 23 and 33 are connected, where the connecting means 22 and 32 are connected and where the connecting means 21 and 31 are connected in the D/A converter shown in FIG. 8. Thus, the total resistance between the positive and negative voltage sources 1 and 2 is $(2^m).R$. Thus, the analog voltage corresponding to the digital value can be corrected by ½ LSB as mentioned before.

Therefore, also the D/A converter according to this embodiment is able to reduce the size because of fewer elements, such as the resistors and switches, than the conventional D/A converter. Moreover, an ideal conversion characteristic can be obtained.

Figure 11:
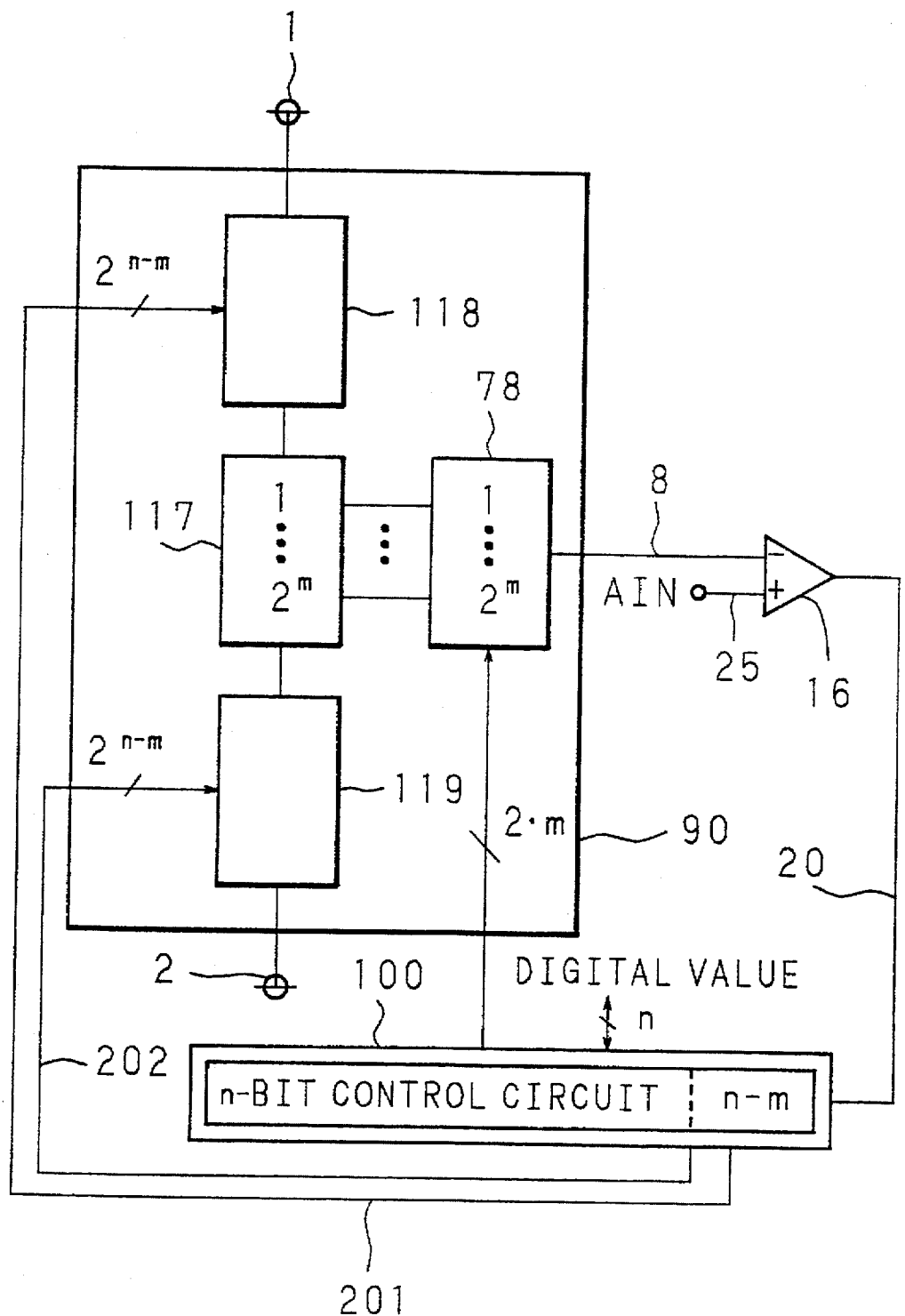
FIG. 11 is a block diagram showing the structure of an A/D converter according to the present invention.

FIG. 11 is a block diagram showing the structure of an A/D converter which employs the sequential approximation and has the D/A converter according to any one of Embodiments 1 to 4.

Similar to Embodiment 1, n=6 and m=4 and correction by ½ LSB is performed. The same elements are designated by the same reference numerals and the explanation is omitted here.

Although the D/A converter 90 may be any one of Embodiments 1 to 4, the description will be performed about the D/A converter according to Embodiment 1 for convenience. An n-bit control circuit 100, which is a second control means, supplies control signals 201 and 202 for connecting or disconnecting the connecting means of the second and third resistance groups 118 and 119 to the D/A converter 90 through respective $2^{n-m}$ signal lines 201 and 202 so that the connecting means 24 and 34 of the second and third resistance groups 118 and 119 are selectively connected. Thus, the connection routes are formed to the positive and negative voltage sources 1 and 2 in order to obtain a resistance value of $(2^m).R$ between the positive and negative voltage sources 1 and 2. Thus, the digital values of high order m bits of n bits are sequentially determined by the sequential approximation method in accordance with the comparison result signal 20 denoting a result of the comparison performed by the comparator 16 between the analog output 8 from the D/A converter 90 which can be obtained by setting the temporary digital values sequentially from the high order bits of m bits and the analog input AIN 25 which is supplied to the input terminal AIN from outside.

Moreover, the n-bit control circuit 100 supplies, to the D/A converter 90, control signals 201 and 202 corresponding to the digital value in which the temporary value is set to low order (n−m) bits of n bits with the switching tree 78 selecting the ladder tap in conversion of m bits so that the connecting means of the second and third resistance groups 118 and 119 are selectively connected. Thus, the connection routes to the positive analog voltage source 1 and negative analog voltage source 2 are changed so that the analog voltage which is transmitted from the ladder tap of the first resistance group 117 is changed at least (n−m) times. By these changes, the voltages of the analog output 8 from the D/A converter 90 and the analog input 25 are compared so that the digital value of the low order (n−m) bits is determined by the sequential approximation method.

Thus, this A/D converter converts the analog input by the sequential approximation method similarly to the conventional A/D converter. However, the voltage of the analog output 8 of the D/A converter 90 employed in the above-mentioned A/D converter is corrected by ½ LSB. As a result, an ideal result of conversion can be obtained.

Although in the above-mentioned embodiments n=6 and m=4, it is an example and the present invention is not limited to this. Moreover, the number of the resistors of the first resistance group or the second and third resistance groups can furthermore be decreased in accordance with weighing on n and m.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

TABLE 1

| a | b | c | d | VOLTAGE OF ANALOG OUTPUT [V] | LADDER TAP |
|---|---|---|---|---|---|
| 0 | 0 | 0 | 0 | 0.000 | T1 |
| 0 | 0 | 0 | 1 | 0.125 | T2 |
| 0 | 0 | 1 | 0 | 0.375 | T3 |
| 0 | 0 | 1 | 1 | 0.625 | T4 |
| 0 | 1 | 0 | 0 | 0.875 | T5 |
| 0 | 1 | 0 | 1 | 1.125 | T6 |
| 0 | 1 | 1 | 0 | 1.375 | T7 |
| 0 | 1 | 1 | 1 | 1.625 | T8 |
| 1 | 0 | 0 | 0 | 1.875 | T9 |
| 1 | 0 | 0 | 1 | 2.125 | T10 |
| 1 | 0 | 1 | 0 | 2.375 | T11 |
| 1 | 0 | 1 | 1 | 2.625 | T12 |
| 1 | 1 | 0 | 0 | 2.875 | T13 |
| 1 | 1 | 0 | 1 | 3.125 | T14 |
| 1 | 1 | 1 | 0 | 3.375 | T15 |
| 1 | 1 | 1 | 1 | 3.625 | T16 |

What is claimed is:

1. A D/A converter comprising:
   (a) a resistance ladder which comprises
      a first resistance group having a resistor string including of a plurality of resistors each having a resistance value of R, connected in series with a total resistance value of $(2^m-1).R$ and $2^m$ ladder taps for taking out divided voltage between first and second reference voltage sources generated at connection nodes between said resistors and an end of said resistor string;
      a second resistance group having a resistor string including $(2^{n-m}-1)$ resistors each having a resistance value of $(½^{n-m}).R$ (where n>m and each of n and m is an integer) and a resistor having a resistance value of $(½^{n-m}-½^{n-m+1}).R$ with an end being connected to one end of said first resistance group, which are connected in series, and connecting means for selectively connecting an end of said resistor string and the connection nodes between the respective resistors to said first reference voltage source, said resistor string having another end connected to the one end of said first resistance group; and
      a third resistance group having a resistor string including $(2^{n-m}-2)$ resistors each having a resistance value of $(½^{n-m}).R$ and a resistor having a resistance value of $(½^{n-m+1}).R$ with an end being connected to another end of said first resistance group, which are connected in series, a resistor having a resistance value of $(1\tfrac{1}{2}^{n-m+1}).R$ and connecting means for selectively connecting the connection nodes between the respective resistors of said resistor string, an end of said resistor string, and an end of said resistor having the resistance value of $(1\tfrac{1}{2}^{n-m+1}).R$ to said second reference voltage source, another end of said resistor having the resistance value of $(1\tfrac{1}{2}^{n-m+1}).R$ being connected to a ladder tap adjacent to ladder taps to which said resistor string is connected;

(b) means for selecting one ladder tap from $2^m$ ladder taps of said first resistance group to take out an analog voltage corresponding to a digital value of the high order m bits among the n bits; and (c) first control means for, in accordance with a case of converting the high order m bits or a case of converting the low order (n–m) bits, forming a connection route between the first and second reference voltage sources with a resistance of $(2^m).R$ appearing therebetween, by selectively combining the connecting means of said second and third resistance groups and for, when converting the low order (n–m) bits, forming said connection route with said ladder tap remaining to be selected, to take out an analog voltage for the m bits from said ladder tap.

2. A D/A converter comprising:

(a) a resistance ladder which comprises a first resistance group having a resistor string including of a plurality of resistors each having a resistance value of R, a resistor having a resistance value of $(1\tfrac{1}{2}^{n-m+1}).R$ (where n>m and each of n and m is an integer) and a resistor having a resistance value of $(\tfrac{1}{2}^{n-m+1}).R$ connected in series with a total resistance value of $(2^m-1).R$ and $2^m$ ladder taps for taking out divided voltage between first and second reference voltage sources generated at connection nodes between said resistors and an end of said resistor string;

a second resistance group having a resistor string including $(2^{n-m}-1)$ resistors each having a resistance value of $(\tfrac{1}{2}^{n-m}).R$ and a resistor having a resistance value of $(\tfrac{2}{3}2^{n-m}-\tfrac{1}{2}^{n-m+1}).R$ with an end being connected to one end of said first resistance group, which are connected in series, and connecting means for selectively connecting an end of said resistor string and the connection nodes between the respective resistors to said first reference voltage source, said resistor string having another end connected to the one end of said first resistance group; and a third resistance group having a resistor string including $(2^{n-m}-2)$ resistors each having a resistance value of $(\tfrac{1}{2}^{n-m}).R$ and a resistor having a resistance value of $(\tfrac{1}{2}^{n-m+1}).R$ with an end being connected to another end of said first resistance group, which are connected in series, and connecting means for selectively connecting the connection nodes of said resistors, another end of said resistor string, and the connection node of said resistor in said first resistance group having the resistance value of $(1\tfrac{1}{2}^{n-m+1}).R$ and said resistor in said first resistance group having the resistance value of $(\tfrac{1}{2}^{n-m+1}).R$ to said second reference voltage source;

(b) means for selecting one ladder tap from $2^m$ ladder taps of said first resistance group to take out an analog voltage corresponding to a digital value of the high order m bits among the n bits; and (c) first control means for, in accordance with a case of converting the high order m bits or a case of converting the low order (n–m) bits, forming a connection route between the first and second reference voltage sources with a resistance of $(2^m).R$ appearing therebetween, by selectively combining the connecting means of said second and third resistance groups and for, when converting the low order (n–m) bits, forming said connection route with said ladder tap remaining to be selected, to take out an analog voltage for the m bits from said ladder tap.

3. A D/A converter comprising:

(a) a resistance ladder which comprises a first resistance group having a resistor string including a plurality of resistors each having a resistance value of R, connected in series with a total resistance value of $(2^m-1).R$ and $2^m$ ladder taps for taking out divided voltage between first and second reference voltage sources generated at connection nodes between said resistors and an end of said resistor string;

a second resistance group having $(2^{n-m}-1)$ resistor strings respectively including resistors each having a resistance value of $(\tfrac{1}{2}^{n-m}).R$ (where n>m and each of n and m is an integer) connected in series where the number of the connected resistors decreases by one from $(2^{n-m}-1)$ to one, a resistor having a resistance value of $(\tfrac{2}{3}2^{n-m}-\tfrac{1}{2}^{n-m+1}).R$ with an end connected to said first resistance group, and connecting means for selectively connecting each end of said resistor strings and another end of said resistor having the resistance value of $(\tfrac{2}{3}2^{n-m}-\tfrac{1}{2}^{n-m+1}).R$ to said first reference voltage source, other ends of said resistor strings being commonly connected to the other end of said resistor having the resistance value of $(\tfrac{2}{3}2^{n-m}-\tfrac{1}{2}^{n-m+1}).R$; and a third resistance group having $(2^{n-m}-2)$ resistor strings respectively including resistors each having a resistance value of $(\tfrac{1}{2}^{n-m}).R$ connected in series where the number of the connected resistors decreases by one from $(2^{n-m}-2)$ to one, a resistor having a resistance value of $(\tfrac{1}{2}^{n-m+1}).R$ with an end being connected to said first resistance group, a resistor having a resistance value of $(1\tfrac{1}{2}^{n-m+1}).R$, and connecting means for selectively connecting each end of said resistor strings, another end of said resistor having the resistance value of $(\tfrac{1}{2}^{n-m+1}).R$ and an end of said resistor having the resistance value of $(\tfrac{1}{2}^{n-m+1}).R$ to said second reference voltage source, other ends of said resistor strings being commonly connected to the other end of said resistor having the resistance value of $(\tfrac{1}{2}^{n-m+1}).R$, and another end of said resistor having the resistance value of $(1\tfrac{1}{2}^{n-m+1}).R$ being connected to a ladder tap adjacent to a ladder tap to which said resistor in said first resistance group having the resistance value of $(\tfrac{1}{2}^{n-m+1}).R$ is connected;

(b) means for selecting one ladder tap from $2^m$ ladder taps of said first resistance group to take out an analog voltage corresponding to a digital value of the high order m bits among the n bits; and (c) first control means for, in accordance with a case of converting the high order m bits or a case of converting the low order (n–m) bits, forming a connection route between the first and second reference voltage sources with a resistance of $(2^m).R$ appearing therebetween, by selectively combining the connecting means of said second and third resistance groups and for, when converting the low order (n–m) bits, forming said connection route with said ladder tap remaining to be selected, to take out an analog voltage for the m bits from said ladder tap.

4. A D/A converter comprising:

(a) a resistance ladder which comprises a first resistance group having a resistor string including a plurality of resistors each having a resistance value of R, a resistor having a resistance value of $(1\frac{1}{2}^{n-m+1}).R$ (where n>m and each of n and m is an integer) and a resistor having a resistance value of $(\frac{1}{2}^{n-m+1}).R$ connected in series with a total resistance value of $(2^m-1).R$ and $2^m$ ladder taps for taking out divided voltage between first and second reference voltage sources generated at connection nodes between said resistors and an end of said resistor string;

a second resistance group having $(2^{n-m}-1)$ resistor strings respectively including resistors each having a resistance value of $(\frac{1}{2}^{n-m}).R$ (where n>m and each of n and m is an integer) connected in series where the number of the connected resistors decreases by one from $(2^{n-m}-1)$ to one, a resistor having a resistance value of $(\frac{2}{2}^{n-m}-\frac{1}{2}^{n-m+1}).R$ with an end connected to said first resistance group, and connecting means for selectively connecting each end of said resistor strings and another end of said resistor having the resistance value of $(\frac{2}{2}^{n-m}-\frac{1}{2}^{n-m+1}).R$ to said first reference voltage source, other ends of said resistor strings being commonly connected to the other end of said resistor having the resistance value of $(\frac{2}{2}^{n-m}-\frac{1}{2}^{n-m+1}).R$; and a third resistance group having $(2^{n-m}-2)$ resistor strings respectively including resistors each having a resistance value of $(\frac{1}{2}^{n-m}).R$ connected in series where the number of the connected resistors decreases by one from $(2^{n-m}-2)$ to one, a resistor having a resistance value of $(\frac{1}{2}^{n-m+1}).R$ with an end being connected to said first resistance group, and connecting means for selectively connecting each end of said resistor strings, another end of said resistor having the resistance value of $(\frac{1}{2}^{n-m+1}).R$, or the connection node of said resistor in said first resistance group having the resistance value of $(1\frac{1}{2}^{n-m+1}).R$ and said resistor in said first resistance group having the resistance value of $(\frac{1}{2}^{n-m+1}).R$ to said second reference voltage source, other ends of said resistor strings being connected to other end of said resistor having the resistance value of $(\frac{1}{2}^{n-m+1}).R$;

(b) means for selecting one ladder tap from $2^m$ ladder taps of said first resistance group to take out an analog voltage corresponding to a digital value of the high order m bits among the n bits; and (c) first control means for, in accordance with a case of converting the high order m bits or a case of converting the low order (n−m) bits, forming a connection route between the first and second reference voltage sources with a resistance of $(2^m).R$ appearing therebetween, by selectively combining the connecting means of said second and third resistance groups and for, when converting the low order (n−m) bits, forming said connection route with said ladder tap remaining to be selected, to take out an analog voltage for the m bits from said ladder tap.

5. An A/D converter comprising:

a D/A converter having (a) a resistance ladder which comprises a first resistance group having a resistor string including of a plurality of resistors each having a resistance value of R, connected in series with a total resistance value of $(2^m-1).R$ and $2^m$ ladder taps for taking out divided voltage between first and second reference voltage sources generated at connection nodes between said resistors and an end of said resistor string;

a second resistance group having a resistor string including $(2^{n-m}-1)$ resistors each having a resistance value of $(\frac{1}{2}^{n-m}).R$ (where n>m and each of n and m is an integer) and a resistor having a resistance value of $(\frac{2}{2}^{n-m}-\frac{1}{2}^{n-m+1}).R$ with an end being connected to one end of said first resistance group, which are connected in series, and connecting means for selectively connecting an end of said resistor string and the connection nodes between the respective resistors to said first reference voltage source, said resistor string having another end connected to the one end of said first resistance group; and a third resistance group having a resistor string including $(2^{n-m}-2)$ resistors each having a resistance value of $(\frac{1}{2}^{n-m}).R$ and a resistor having a resistance value of $(\frac{1}{2}^{n-m+1}).R$ with an end being connected to another end of said first resistance group, which are connected in series, a resistor having a resistance value of $(1\frac{1}{2}^{n-m+1}).R$ and connecting means for selectively connecting the connection nodes between the respective resistors of said resistor string, an end of said resistor string, and an end of said resistor having the resistance value of $(1\frac{1}{2}^{n-m+1}).R$ to said second reference voltage source, another end of said resistor having the resistance value of $(1\frac{1}{2}^{n-m+1}).R$ being connected to a ladder tap adjacent to ladder taps to which said resistor string is connected;

(b) means for selecting one ladder tap from $2^m$ ladder taps of said first resistance group to take out an analog voltage corresponding to a digital value of the high order m bits among the n bits; and (c) first control means for, in accordance with a case of converting the high order m bits or a case of converting the low order (n−m) bits, forming a connection route between the first and second reference voltage sources with a resistance of $(2^m).R$ appearing therebetween, by selectively combining the connecting means of said second and third resistance groups and for, when converting the low order (n−m) bits, forming said connection route with said ladder tap remaining to be selected, to take out an analog voltage for the m bits from said ladder tap;

a comparator for comparing an analog output from said D-A converter with an analog input to convert; and second control means for supplying to said D-A converter a digital value which is provisionally set in order to obtain a reference analog voltage for a comparison for digital-converting said analog input, for, in a conversion of the high order m bits, causing said D-A converter to form a connection route through which a potential difference between the first and second reference voltage sources is divided into $2^m$ levels, and for, in a conversion of the low order (n−m) bits, causing said D-A converter to change the connection route on the basis of the comparison result of said comparator with the ladder tap remaining to be selected in the conversion of the m bits, thereby changing at least (n–m) times an analog output from the ladder tap selected in the conversion of m bits.

6. An A/D converter comprising:
a D/A converter having
(a) a resistance ladder which comprises
a first resistance group having a resistor string including of a plurality of resistors each having a resistance value of R, a resistor having a resistance value of $(1\frac{1}{2}^{n-m+1})$.R (where n>m and each of n and m is an integer) and a resistor having a resistance value of $(\frac{1}{2}^{n-m+1})$.R connected in series with a total resistance value of $(2^m-1)$.R and $2^m$ ladder taps for taking out divided voltage between first and second reference voltage sources generated at connection nodes between said resistors and an end of said resistor string;
a second resistance group having a resistor string including $(2^{n-m}-1)$ resistors each having a resistance value of $(\frac{1}{2}^{n-m})$.R and a resistor having a resistance value of $(\frac{3}{2}^{n-m}-\frac{1}{2}^{n-m+1})$.R with an end being connected to one end of said first resistance group, which are connected in series, and connecting means for selectively connecting an end of said resistor string and the connection nodes between the respective resistors to said first reference voltage source, said resistor string having another end connected to the one end of said first resistance group; and
a third resistance group having a resistor string including $(2^{n-m}-2)$ resistors each having a resistance value of $(\frac{1}{2}^{n-m})$.R and a resistor having a resistance value of $(\frac{1}{2}^{n-m+1})$.R with an end being connected to another end of said first resistance group, which are connected in series, and connecting means for selectively connecting the connection nodes of said resistors, another end of said resistor string, and the connection node of said resistor in said first resistance group having the resistance value of $(1\frac{1}{2}^{n-m+1})$.R and said resistor in said first resistance group having the resistance value of $(\frac{1}{2}^{n-m+1})$.R to said second reference voltage source;
(b) means for selecting one ladder tap from $2^m$ ladder taps of said first resistance group to take out an analog voltage corresponding to a digital value of the high order m bits among the n bits; and
(c) first control means for, in accordance with a case of converting the high order m bits or a case of converting the low order (n–m) bits, forming a connection route between the first and second reference voltage sources with a resistance of $(2^m)$.R appearing therebetween, by selectively combining the connecting means of said second and third resistance groups and for, when converting the low order (n–m) bits, forming said connection route with said ladder tap remaining to be selected, to take out an analog voltage for the m bits from said ladder tap;
a comparator for comparing an analog output from said D-A converter with an analog input to convert; and
second control means for supplying to said D-A converter a digital value which is provisionally set in order to obtain a reference analog voltage for a comparison for digital-converting said analog input, for, in a conversion of the high order m bits, causing said D-A converter to form a connection route through which a potential difference between the first and second reference voltage sources is divided into $2^m$ levels, and for, in a conversion of the low order (n–m) bits, causing said D-A converter to change the connection route on the basis of the comparison result of said comparator with the ladder tap remaining to be selected in the conversion of the m bits, thereby changing at least (n–m) times an analog output from the ladder tap selected in the conversion of m bits.

7. An A/D converter comprising:
a D/A converter having
(a) a resistance ladder which comprises
a first resistance group having a resistor string including a plurality of resistors each having a resistance value of R, connected in series with a total resistance value of $(2^m-1)$.R and $2^m$ ladder taps for taking out divided voltage between first and second reference voltage sources generated at connection nodes between said resistors and an end of said resistor string;
a second resistance group having $(2^{n-m}-1)$ resistor strings respectively including resistors each having a resistance value of $(\frac{1}{2}^{n-m})$.R (where n>m and each of n and m is an integer) connected in series where the number of the connected resistors decreases by one from $(2^{n-m}-1)$ to one, a resistor having a resistance value of $(\frac{3}{2}^{n-m}-\frac{1}{2}^{n-m+1})$.R with an end connected to said first resistance group, and connecting means for selectively connecting each end of said resistor strings and another end of said resistor having the resistance value of $(\frac{3}{2}^{n-m}-\frac{1}{2}^{n-m+1})$.R to said first reference voltage source, other ends of said resistor strings being commonly connected to the other end of said resistor having the resistance value of $(\frac{3}{2}^{n-m}-\frac{1}{2}^{n-m+1})$.R; and
a third resistance group having $(2^{n-m}-2)$ resistor strings respectively including resistors each having a resistance value of $(\frac{1}{2}^{n-m})$.R connected in series where the number of the connected resistors decreases by one from $(2^{n-m}-2)$ to one, a resistor having a resistance value of $(\frac{1}{2}^{n-m+1})$.R with an end being connected to said first resistance group, a resistor having a resistance value of $(1\frac{1}{2}^{n-m+1})$.R, and connecting means for selectively connecting each end of said resistor strings, another end of said resistor having the resistance value of $(\frac{1}{2}^{n-m+1})$.R and an end of said resistor having the resistance value of $(\frac{1}{2}^{n-m+1})$.R to said second reference voltage source, other ends of said resistor strings being commonly connected to the other end of said resistor having the resistance value of $(\frac{1}{2}^{n-m+1})$.R, and another end of said resistor having the resistance value of $(1\frac{1}{2}^{n-m+1})$.R being connected to a ladder tap adjacent to a ladder tap to which said resistor in said first resistance group having the resistance value of $(\frac{1}{2}^{n-m+1})$.R is connected;
(b) means for selecting one ladder tap from $2^m$ ladder taps of said first resistance group to take out an analog voltage corresponding to a digital value of the high order m bits among the n bits; and
(c) first control means for, in accordance with a case of converting the high order m bits or a case of converting the low order (n–m) bits, forming a connection route between the first and second reference voltage sources with a resistance of $(2^m).R$ appearing therebetween, by selectively combining the connecting means of said second and third resistance groups and for, when converting the low order (n−m) bits, forming said connection route with said ladder tap remaining to be selected, to take out an analog voltage for the m bits from said ladder tap;

a comparator for comparing an analog output from said D-A converter with an analog input to convert; and second control means for supplying to said D-A converter a digital value which is provisionally set in order to obtain a reference analog voltage for a comparison for digital-converting said analog input, for, in a conversion of the high order m bits, causing said D-A converter to form a connection route through which a potential difference between the first and second reference voltage sources is divided into $2^m$ levels, and for, in a conversion of the low order (n−m) bits, causing said D-A converter to change the connection route on the basis of the comparison result of said comparator with the ladder tap remaining to be selected in the conversion of the m bits, thereby changing at least (n−m) times an analog output from the ladder tap selected in the conversion of m bits.

8. An A/D converter comprising:

a D/A converter having (a) a resistance ladder which comprises a first resistance group having a resistor string including a plurality of resistors each having a resistance value of R, a resistor having a resistance value of $(1\frac{1}{2}^{n-m+1}).R$ (where n>m and each of n and m is an integer) and a resistor having a resistance value of $(\frac{1}{2}^{n-m+1}).R$ connected in series with a total resistance value of $(2^m-1).R$ and $2^m$ ladder taps for taking out divided voltage between first and second reference voltage sources generated at connection nodes between said resistors and an end of said resistor string;

a second resistance group having $(2^{n-m}-1)$ resistor strings respectively including resistors each having a resistance value of $(\frac{1}{2}^{n-m}).R$ (where n>m and each of n and m is an integer) connected in series where the number of the connected resistors decreases by one from $(2^{n-m}-1)$ to one, a resistor having a resistance value of $(\frac{2}{3}^{n-m}-\frac{1}{2}^{n-m+1}).R$ with an end connected to said first resistance group, and connecting means for selectively connecting each end of said resistor strings and another end of said resistor having the resistance value of $(\frac{2}{3}^{n-m}-\frac{1}{2}^{n-m+1}).R$ to said first reference voltage source, other ends of said resistor strings being commonly connected to the other end of said resistor having the resistance value of $(\frac{2}{3}^{n-m}-\frac{1}{2}^{n-m+1}).R$; and a third resistance group having $(2^{n-m}-2)$ resistor strings respectively including resistors each having a resistance value of $(\frac{1}{2}^{n-m}).R$ connected in series where the number of the connected resistors decreases by one from $(2^{n-m}-2)$ to one, a resistor having a resistance value of $(\frac{1}{2}^{n-m+1}).R$ with an end being connected to said first resistance group, and connecting means for selectively connecting each end of said resistor strings, another end of said resistor having the resistance value of $(\frac{1}{2}^{n-m+1}).R$, or the connection node of said resistor in said first resistance group having the resistance value of $(1\frac{1}{2}^{n-m+1}).R$ and said resistor in said first resistance group having the resistance value of $(\frac{1}{2}^{n-m+1}).R$ to said second reference voltage source, other ends of said resistor strings being commonly connected to other end of said resistor having the resistance value of $(\frac{1}{2}^{n-m+1}).R$;

(b) means for selecting one ladder tap from $2^m$ ladder taps of said first resistance group to take out an analog voltage corresponding to a digital value of the high order m bits among the n bits; and (c) first control means for, in accordance with a case of converting the high order m bits or a case of converting the low order (n−m) bits, forming a connection route between the first and second reference voltage sources with a resistance of $(2^m).R$ appearing therebetween, by selectively combining the connecting means of said second and third resistance groups and for, when converting the low order (n−m) bits, forming said connection route with said ladder tap remaining to be selected, to take out an analog voltage for the m bits from said ladder tap;

a comparator for comparing an analog output from said D-A converter with an analog input to convert; and second control means for supplying to said D-A converter a digital value which is provisionally set in order to obtain a reference analog voltage for a comparison for digital-converting said analog input, for, in a conversion of the high order m bits, causing said D-A converter to form a connection route through which a potential difference between the first and second reference voltage sources is divided into $2^m$ levels, and for, in a conversion of the low order (n−m) bits, causing said D-A converter to change the connection route on the basis of the comparison result of said comparator with the ladder tap remaining to be selected in the conversion of the m bits, thereby changing at least (n−m) times an analog output from the ladder tap selected in the conversion of m bits.

* * * * *